(12) United States Patent
Tsutsui et al.

(10) Patent No.: US 6,297,119 B1
(45) Date of Patent: Oct. 2, 2001

(54) SEMICONDUCTOR DEVICE AND ITS MANUFACTURE

(75) Inventors: Yutaka Tsutsui; Masaru Wakabayashi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/369,267

(22) Filed: Aug. 6, 1999

(30) Foreign Application Priority Data

Aug. 7, 1998 (JP) .................................................. 10-224479

(51) Int. Cl.⁷ .................................................. H01L 21/8228
(52) U.S. Cl. .......................... 438/322; 438/309; 438/313; 438/326; 438/547
(58) Field of Search .................................... 438/202, 203, 438/204, 205, 206, 207, 208, 313, 314, 322, 326, 327, 309, 546, 547; 257/569, 574, 592

(56) References Cited

U.S. PATENT DOCUMENTS

| | | | |
|---|---|---|---|
| 4,357,622 | * | 11/1982 | Magdo et al. ........................ 257/555 |
| 5,693,505 | * | 12/1997 | Kobayashi ............................ 438/217 |
| 5,950,080 | * | 9/1999 | Yoshida ................................ 438/202 |
| 5,966,599 | * | 10/1999 | Walker et al. ........................ 438/228 |
| 6,001,701 | * | 12/1999 | Carroll et al. ....................... 438/364 |

FOREIGN PATENT DOCUMENTS

| | | |
|---|---|---|
| 4-96362 | 3/1992 | (JP) . |
| 4-180260 | 6/1992 | (JP) . |
| 6-21366 | 1/1994 | (JP) . |
| 10-70194 | 3/1998 | (JP) . |

* cited by examiner

Primary Examiner—Carl Whitehead, Jr.
Assistant Examiner—Jeff Vockrodt
(74) Attorney, Agent, or Firm—Foley & Lardner

(57) ABSTRACT

The present invention discloses a semiconductor device having a PNP bipolar transistor and an NPN bipolar transistor having excellent transistor characteristics formed on the same semiconductor substrate, and a method of manufacturing the semiconductor device.

This semiconductor device is provided with a first n-type well and a second n-type well formed at substantially the same depths in a semiconductor substrate, an NPN bipolar transistor formed within the first n-type well which uses the n-type well as its collector, a p-type well formed within the second n-type well, and a PNP bipolar transistor formed within the p-type well which uses the p-type well as its collector.

8 Claims, 23 Drawing Sheets

SEMICONDUCTOR DEVICE AND ITS MANUFACTURE

BACKGROUND OF THE INVENTION

1. Field of the Invention

The present invention relates to a semiconductor device provided with bipolar transistors formed on a semiconductor substrate, and its manufacturing method, and more particularly to a semiconductor device having bipolar transistors formed in respective wells provided in a semiconductor substrate, and its manufacturing method.

2. Description of the Related Art

Methods of various kinds which do not employ epitaxially grown layers as a method of manufacturing a semiconductor device having bipolar transistors on a silicon substrate have been proposed in the past.

For example, a method of forming well regions of MOSFETs and well regions of bipolar transistors by a simultaneous ion implantation in the manufacture of a semiconductor device in which the MOSFETs and the bipolar transistors are formed on an identical substrate, has been disclosed in Publication of Unexamined Patent Applications, No. Hei 4-180260.

Here, referring to FIG. 23, the method of manufacturing a semiconductor device mentioned in the Publication will be described briefly. As shown in FIG. 23, the semiconductor device has an NPN bipolar transistor, a PNP bipolar transistor, an nMOS transistor, and a PMOS transistor on an identical p-type silicon substrate.

In the manufacturing method in the above, an n-type collector of the NPN bipolar transistor and an n-type well region 23 of the pMOS transistor, and a p-type collector of the PNP bipolar transistor and a p-type well region 26 of the nMOS transistor are formed by the same ion implantations, respectively. In this method, only the two steps of forming the well region 23 and the well region 26 suffice for the purpose by sharing the wells without using epitaxially grown layers. Accordingly, the element characteristics are superior and the step number does not increase compared with the conventional method.

Now, the formation of a mask is a time and cost consuming work that requires many processings such as coating of a photoresist film, exposure, fixation, mask inspection, and the like. Moreover, an increasingly longer time is being required for positioning of the mask because of the decreasing margin in the positional deviation accompanying the refinements in the integrated circuits.

Accordingly, the formation of prescribed impurity regions by ion implantations using a smaller number of masks is extremely important for the manufacture of a semiconductor device with high fabrication precision through reduction in the manufacturing cost. At the same time, it is becoming important to make the characteristics of individual elements in the semiconductor device to be optimized and highly efficient accompanying the development in the high performance and composite functioning of the semiconductor device.

Although the above invention proposes a cost effective method of formation of the well regions of the MOS transistors and the collector regions of the bipolar transistors, it is not possible to optimize the characteristics of the respective elements.

According to the method in the Publication, the n-type collector of the NPN transistor and the n-type well of the pMOS transistor, and the p-type collector of the PNP transistor and the p-type well of the nMOS are formed respectively by the same ion implantations, as shown in FIG. 23. By so doing, it is claimed that a reduction in the number of manufacturing steps can be realized.

Now, when the gate length of the MOS transistors is decreased, the threshold voltages of the n-type well of the pMOS transistor and the p-type well of the nMOS transistor are reduced due to the short channel effect. As a countermeasure against this, it is general to suppress the short channel effect by raising the impurity concentration of the wells of the MOS transistors.

However, according to the method in the Publication, the n-type collector of the NPN transistor and the n-type well (the n well 23 in FIG. 23) of the pMOS transistor, and the p-type collector of the PNP transistor and the p-type well (the p well 26 in FIG. 23) of the nMOS transistor are respectively shared by each other. Therefore, when the impurity concentrations of the wells of the MOS transistors are raised, the impurity concentrations of the collectors of the bipolar transistors are also raised, and their base-collector junction breakdown strengths are lowered. That is, if the transistor characteristics of the MOS transistors are enhanced, the transistor characteristics of the bipolar transistors are degraded, and on the contrary, if the transistor characteristics of the bipolar transistors are enhanced, the transistor characteristics of the MOS transistors are degraded. Consequently, it is difficult to simultaneously obtain satisfactory transistor characteristics for both of the MOS transistors and the bipolar transistors.

SUMMARY OF THE INVENTION

It is therefore a first object of the present invention to provide a method of manufacturing a semiconductor device having bipolar transistors with satisfactory transistor characteristics formed on a semiconductor substrate using a smaller number of masks.

It is a second object of the present invention to provide a semiconductor device having bipolar transistors with transistor characteristics superior compared with the conventional device.

In this invention, differing from the conventional method, the wells of the MOS transistors and the collectors of the bipolar transistors are formed separately, and an n-type collector of the NPN transistor and an n-type isolation region for a p-type collector of the PNP transistor are formed at the same time. In this way, satisfactory element characteristics of the MOS transistors and the bipolar transistors are obtained simultaneously while reducing the number of manufacturing steps.

In order to achieve the first object, a manufacturing method (referred to as a first method of the invention) of the semiconductor device according to this invention is a method of manufacturing a semiconductor device equipped with a first bipolar transistor having a first conductivity type base region and a second bipolar transistor having a second conductivity type base region on the same second conductivity type silicon substrate, in which the formation of impurity regions includes, a step of simultaneously forming a first conductivity type collector region of the second bipolar transistor, and a first conductivity type isolation region for a second conductivity type collector region of the first bipolar transistor by an ion implantation of a first conductivity type impurity, and a step of simultaneously forming a second conductivity type base region of the second bipolar transistor and a temporary second conductivity type base region of the first bipolar transistor by an ion implantation of a second conductivity type impurity, then converting the temporary second conductivity type base region of the first bipolar transistor into a first conductivity type base region by an ion implantation of a first conductivity type impurity.

In the first method of the invention, either the first conductivity type may be chosen to be the n-type and the second conductivity type the p-type, or the first conductivity type may be chosen to be the p-type and the second conductivity type the n-type. This choice applies also to the other methods that follow.

In the first method of the invention, the temporary second conductivity type base region of the first bipolar transistor is converted into a first conductivity type base region by a reverse ion implantation with the first conductivity type impurity, so that it is possible to form predetermined impurity regions with a smaller number of masks. Here, what is meant by the reverse ion implantation is to convert a one conductivity type region formed by the ion implantation of a one conductivity type impurity into an opposite conductivity type region by the ion implantation of an opposite conductivity type impurity.

In order to achieve the second object, the semiconductor device according to this invention comprises a first conductivity type semiconductor substrate, a second conductivity type first well provided in the semiconductor substrate, a second conductivity type second well formed at a depth substantially equal to that of the first well, a first bipolar transistor formed within the first well with the first well as its collector, a first conductivity type third well formed within the second well, and a second bipolar transistor formed within the third well with the third well as its collector.

Another semiconductor device according to this invention comprises a first conductivity type semiconductor substrate, a second conductivity type first well formed within the semiconductor substrate, a second conductivity type annular isolation region formed in a cylindrical form at a substantially equal depth as that of the first well, a second conductivity type second well formed so as to be adjacent to the annular isolation region and reaching a larger depth than that of the annular isolation region, a first conductivity type third well formed in the region surrounded by the annular isolation region and the second well, a first bipolar transistor formed within the first well with the first well as its collector, and a second bipolar transistor formed within the third well with the third well as its collector.

Another semiconductor device according to this invention comprises a first conductivity type semiconductor substrate, a second conductivity type first well for the formation of a MOS transistor provided within the semiconductor substrate, a second conductivity type annular isolation region formed in a tubular form at a depth substantially equal to that of the first well, a second conductivity type second well formed so as to be adjacent to the annular isolation region reaching a depth larger than that of the annular isolation region, a first conductivity type third well formed in the region surrounded by the annular isolation region and the second well, and a bipolar transistor formed within the third well with the third well as its collector.

Still another semiconductor device according to this invention has, in a semiconductor device provided with a bipolar transistor having a first conductivity type base region in a second conductivity type silicon substrate, a first conductivity type isolation region for electrically isolating a second conductivity type collector region of a bipolar transistor from the second conductivity type silicon substrate comprises a second conductivity type lower isolation region formed so as to make contact with the entire lower part of a second conductivity type collector region, and a second conductivity type annular isolation region which surrounds the periphery of the second conductivity type collector region and at least the upper periphery of the second conductivity type lower isolation region.

In addition, the device may include a bipolar transistor having a second conductivity type base region on the same silicon substrate, and may further include a first conductivity type MOSFET and a second conductivity type MOSFET formed on the same silicon substrate.

In this invention, since, for example, the n-type isolation region for electrically isolating the p-type collector of the PNP bipolar transistor from the p-type substrate is constituted of the n-type lower isolation region and the n-type annular isolation region, the margin in the depth direction of the n-type lower isolation region can be made large, facilitating the formation and enabling the reduction in the formation cost, of the device.

In order to achieve the first object, another method of manufacture (referred to as a second method of the invention hereinafter) according to this invention is a method for manufacturing a semiconductor device equipped with a first bipolar transistor having a first conductivity base region and a second bipolar transistor having a second conductivity type base region formed on the same second conductivity type silicon substrate, wherein the formation of impurity regions includes, a step of simultaneously forming a first conductivity type collector region of the second bipolar transistor and an annular first conductivity type isolation region that makes contact with the periphery of the collector formation region of the first bipolar transistor by an ion implantation of a first conductivity type impurity, and a step of forming a first conductivity type lower isolation region in a second conductivity type collector formation region of the first bipolar transistor and in a region including a still lower region by the ion implantation of a first conductivity type impurity, then forming a second conductivity type collector region in a collector formation region of the first bipolar transistor by the ion implantation of a second conductivity type impurity using the same mask used above, and forming a first conductivity type base region of the first bipolar transistor by the ion implantation of a first conductivity type impurity using again the same mask.

In order to achieve the first object, still another method (referred to as a third method of the invention) of manufacturing a semiconductor device is a method of manufacturing a semiconductor device provided with a first bipolar transistor having a first conductivity type base region, a first conductivity type MOSFET and a second conductivity type MOSFET on the same silicon substrate, wherein the formation of impurity regions includes, a step of simultaneously forming a first conductivity type well region of the second conductivity type MOSFET and a first conductivity type annular isolation region making contact with the periphery of a collector formation region of the first bipolar transistor by an ion implantation of a first conductivity type impurity, a step of forming a first conductivity type lower isolation region in a region including the collector formation region of the first bipolar transistor and a region further below by an ion implantation of a first conductivity type impurity, and a step of forming a second conductivity type collector region in the collector formation region of the first bipolar transistor by an ion implantation of a second conductivity type impurity using the same mask as that used in the step just mentioned, and forming a first conductivity type base region of the first bipolar transistor by an ion implantation of a first conductivity type impurity using again the same mask.

In order to achieve the first object, a further separate method (referred to as a fourth method of the invention hereinafter) of manufacturing the semiconductor device according to this invention is a method of manufacturing a semiconductor device provided with a first bipolar transistor having a first conductivity type base region, a second bipolar transistor having a second conductivity type base region, a first conductivity type MOSFET, and a second conductivity type MOSFET formed on the same silicon substrate, wherein the formation of impurity regions includes, a first ion implantation step of first conductivity type impurity for simultaneously forming a first conductivity type well region of the second conductivity type MOSFET and a first conductivity type annular isolation region making contact with the periphery of a collector formation region of the first bipolar transistor by an ion implantation of a first conductivity type impurity, a first ion implantation step of second conductivity type impurity for simultaneously forming a second conductivity type well region of the first conductivity type MOSFET and a second conductivity type insulating well region for electrically isolating the second bipolar transistor and the first bipolar transistor with each other by an ion implantation of a second conductivity type impurity, a second ion implantation step of first conductivity type impurity for forming a first conductivity type collector region of the second bipolar transistor by an ion implantation of a first conductivity type impurity, a second ion implantation step of a second conductivity type impurity for forming a second conductivity type base region of the second bipolar transistor by an ion implantation of a second conductivity type impurity using the same mask as that used in the second ion implantation step of a first conductivity type impurity, a third ion implantation step of first conductivity type impurity for forming a first conductivity type lower isolation region in a region including the collector formation region of the first bipolar transistor and a region further below by an ion implantation of a first conductivity type impurity, a third ion implantation step of second conductivity type impurity for forming a second conductivity type collector region in the collector formation region of the first bipolar transistor by an ion implantation of a second conductivity type impurity using the same mask as that used in the third of ion implantation of a first conductivity type impurity, and a fourth ion implantation step of first conductivity type impurity for forming a first conductivity type base region of the first bipolar transistor by an ion implantation of a first conductivity type impurity using the same mask as that used in the third of ion implantation of a second conductivity type impurity.

In the second to the fourth methods of the invention, in the formation of the impurity regions, the n-type lower isolation region, then the n-type collector region of the PNP, for example, are respectively formed independently without increasing the number of required masks. Accordingly, the depth of formation of the n-type collector region can be controlled freely.

Moreover, since the n-type base region of the PNP is formed independently in the second to the fourth methods of the invention, instead of the reversed ion implantation employed in the first method of the invention, it is possible to control the peak concentration of the impurity as desired.

BRIEF DESCRIPTION OF THE DRAWINGS

The above and other objects, features and advantages of the present invention will be more apparent from the following description taken in conjunction with the accompanying drawings, in which.

DESCRIPTION OF THE PREFERRED EMBODIMENTS

Referring to the accompanying drawings, each embodiment of this invention will be described specifically and in detail in the following.

Embodiment 1

Figure 1:
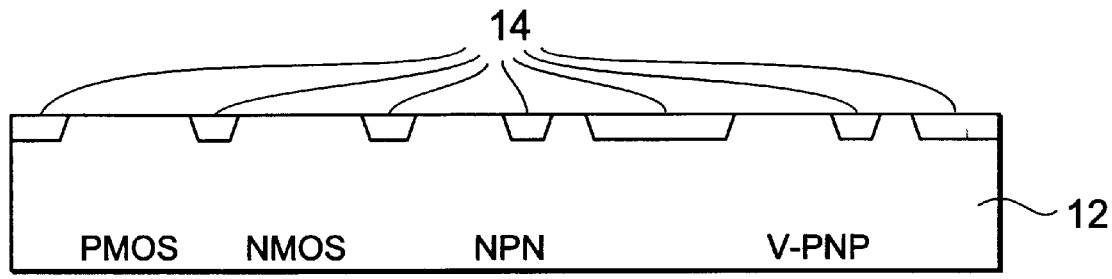
FIGS. 1(A), (B) and (C) illustrate the cross-sectional views of the layer structure of respective steps in the manufacture of a semiconductor device according to a first embodiment of the invention.
Figure 1:
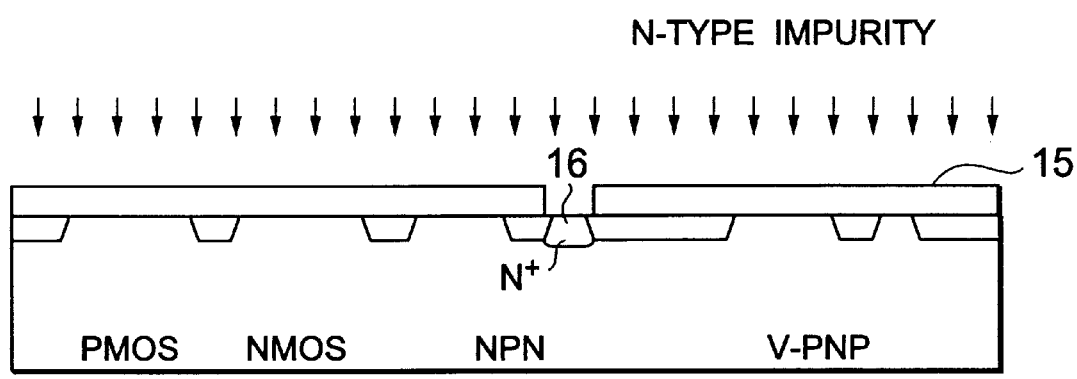
Figure 1:
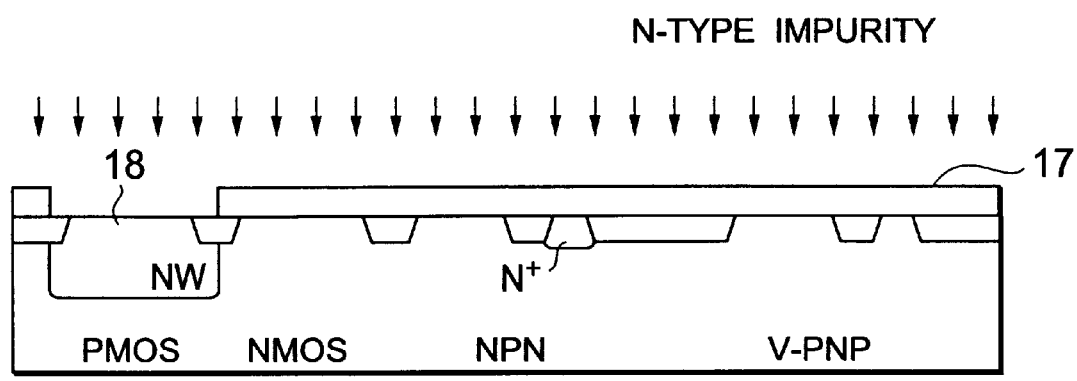
Figure 2:
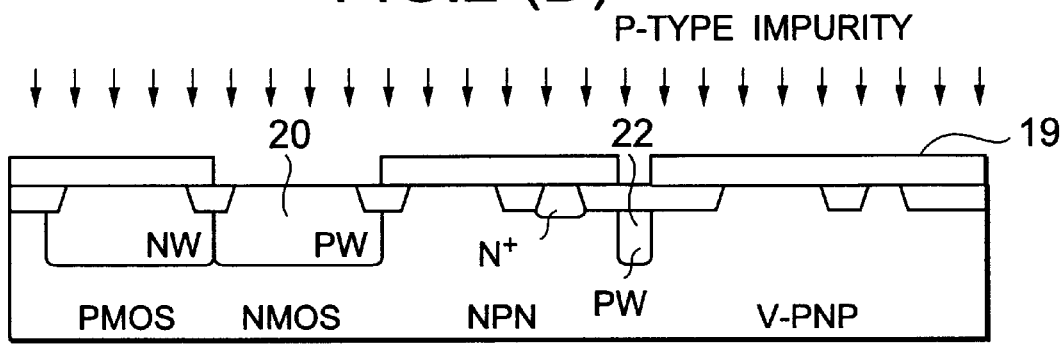
FIGS. 2(D), (E) and (F) illustrate the cross-sectional views of the layer structure of respective steps in the manufacture of the semiconductor device according to the first embodiment of the invention, consecutive to FIG. 1.
Figure 2:
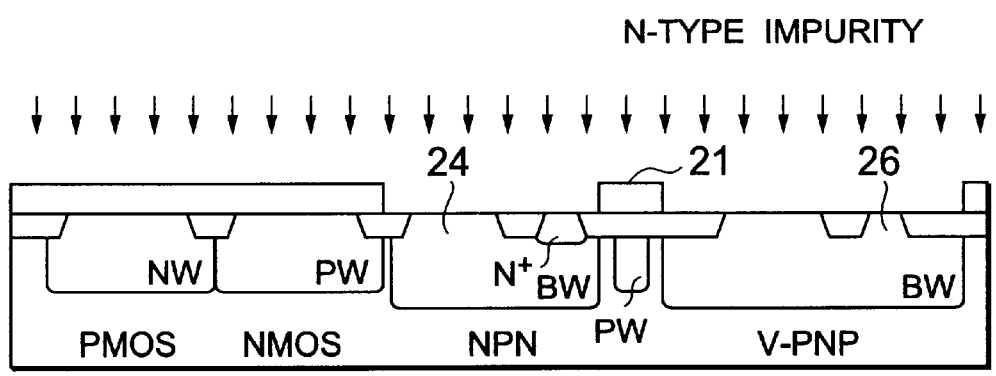
Figure 2:
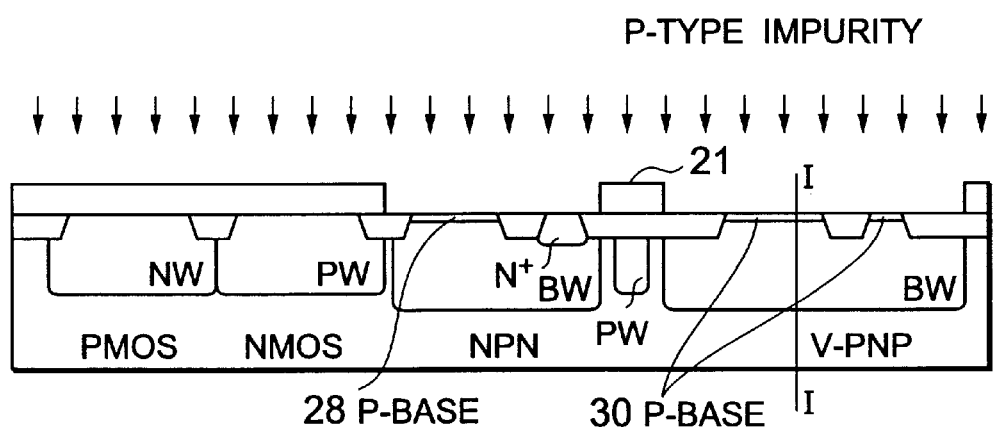
Figure 3:
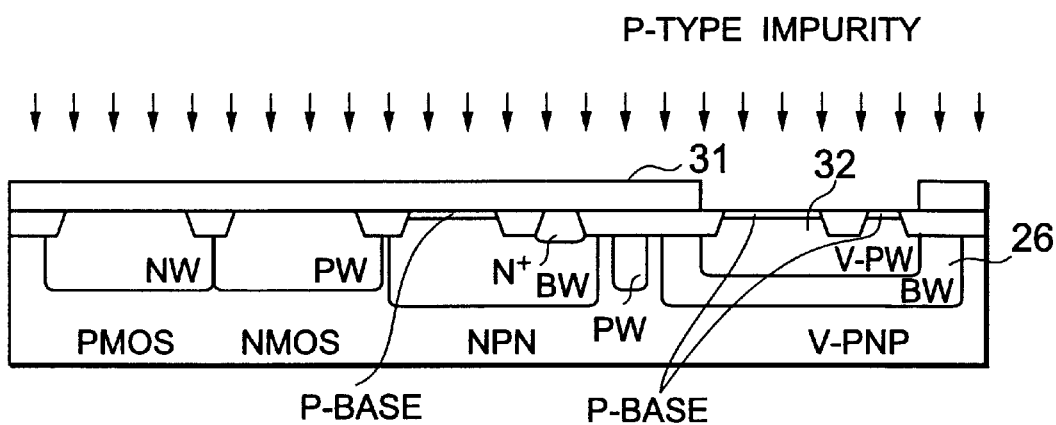
FIGS. 3(G) and (H) illustrate the cross-sectional views of the layer structure of respective steps in the manufacture of the semiconductor device according to the first embodiment of the invention, consecutive to FIG. 2.
Figure 3:
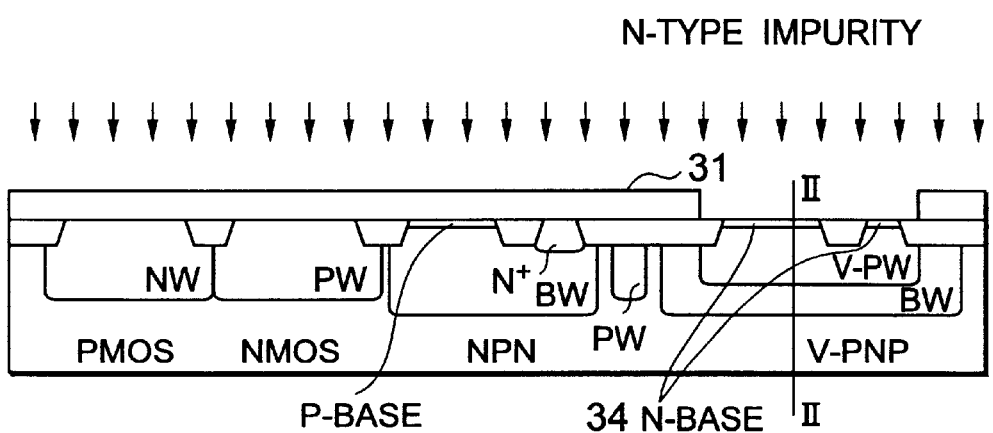

This embodiment is an example of the manufacturing method of the semiconductor device according to the first method of the invention. FIG. 1 to FIG. 3 illustrates the cross-sectional views of the layer structure of respective steps in the manufacture of the semiconductor device according to the manufacturing method of this embodiment.

In this embodiment, first, as shown in FIG. 1(A), an element isolation region 14 is provided by forming a 200 to 500 nm thick silicon oxide film on the surface of a p-type silicon substrate 1 to mutually isolate the formation regions of a p-type MOSFET, an n-type MOSFET, an NPN bipolar transistor, and a vertical PNP bipolar transistor (abbreviated as PMOS, NMOS, NPN, and V-PNP, respectively, hereinafter).

Next, as shown in FIG. 1(B), a mask 15 of photoresist film is formed, and an n-type collector electrode lead-out region 16 of the NPN is formed by implanting ions of an n-type impurity with energy of 50 to 100 keV at a dose of $5 \times 10^{15}$ to $1 \times 10^{16}$ cm$^{-2}$.

Next, as shown in FIG. 1(C), a mask 17 of photoresist film is formed, and an n-type well region (NW) 18 of the PMOS is formed by implanting ions of an n-type impurity with energy of 600 to 800 keV at a dose of $1 \times 10^{13}$ to $1 \times 10^{14}$ cm$^{-2}$.

Next, as shown in FIG. 2(D), a mask 19 of photoresist film is formed, and a p-type well region (PW) 20 of the NMOS and an insulating well region (PW) 22 between the NPN and the V-PNP are formed simultaneously by implanting ions of a p-type impurity with energy of 100 to 300 keV at a dose of $1 \times 10^{13}$ to $1 \times 10^{14}$ cm$^{-2}$.

Next, as shown in FIG. 2(E), a mask 21 of photoresist film is formed, and an n-type collector region (BW) 24 of the NPN and an n-type isolation region (BW) 26 of the V-PNP are formed simultaneously by implanting ions of phosphorus, as an n-type impurity, with energy of 1000 to 1300 keV at a dose of $1 \times 10^{13}$ to $5 \times 10^{13}$ cm$^{-2}$.

Next, as shown in FIG. 2(F), a p-type base region (P-Base) 28 of the NPN and a temporary p-type base region (P-Base) 30 of the V-PNP are formed simultaneously by implanting ions of boron or BF$_2$, as a p-type impurity, with energy which will not cause the ions to penetrate the element isolation region 14 at a dose of $1 \times 10^{13}$ to $4 \times 10^{13}$ cm$^{-2}$, using the same mask as that shown in FIG. 2(E).

Next, as shown in FIG. 3(G), a mask 31 of photoresist film is formed, and a p-type collector region (V-PW) 32 of the V-PNP is formed within the n-type isolation region (BW) 26 by implanting ions of boron, as a p-type impurity, with energy of 100 to 300 keV at a dose of $1 \times 10^{13}$ to $5 \times 10^{13}$ cm$^{-2}$.

Next, as shown in FIG. 3(H), ions of phosphorus, as an n-type impurity, with energy which does not cause the ions to penetrate the element isolation region 14 are implanted, in the fashion of the so-called reversed ion implantation, at a dose of $4 \times 10^{13}$ to $1 \times 10^{14}$ cm$^{-2}$, using the mask 31 same as that shown in FIG. 3(G). As a result, the temporary p-type base region (P-Base) 30 of the V-PNP is converted to an n-type base region (N-Base) 34.

Figure 4:
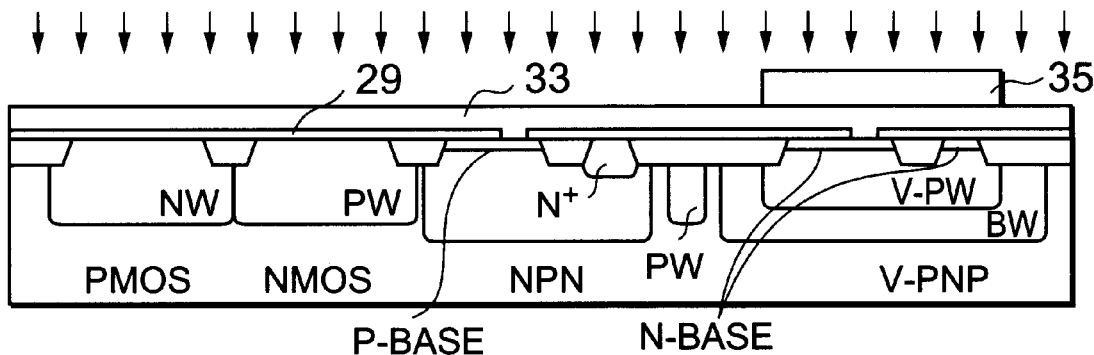
FIGS. 4(I) and (J) illustrate the cross-sectional views of the layer structure of respective steps in the manufacture of the semiconductor device according to the first embodiment of the invention, consecutive to FIG. 3.
Figure 4:
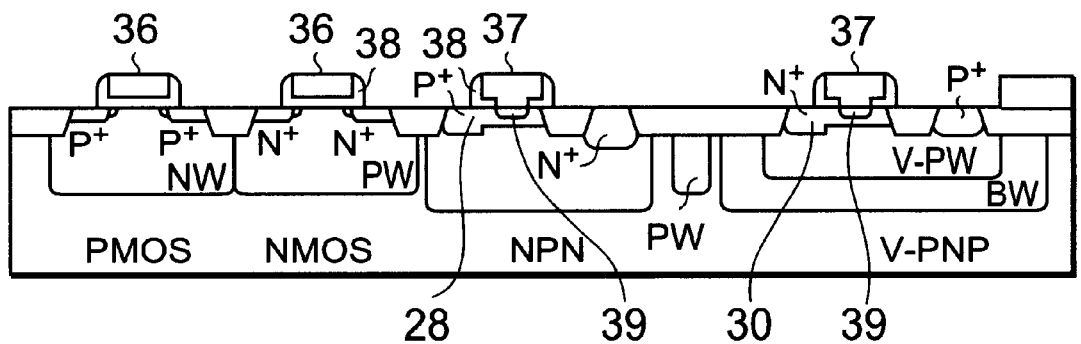

Next, as shown in FIG. 4(I), a gate oxide film 29 is formed, then emitter contacts of the NPN and V-PNP are opened in the gate oxide film 29, and a polysilicon film 33 is formed on the entire surface of the substrate. Following that, a mask 35 is formed on the PNP formation region, and an n-type impurity is implanted heavily into the polysilicon film 33 excluding the V-PNP formation region.

Following that, a mask having an opening in the V-PNP formation region is formed on the surface of the substrate, though not shown, and a p-type impurity is implanted heavily into the V-PNP formation region of the polysilicon film 33, then the substrate is subjected to a heat treatment to diffuse the impurity ions implanted into the polysilicon film.

Next, gate electrodes 36 of the PMOS and the NMOS and emitter electrodes 37 of the NPN and the V-PNP are formed by patterning the polysilicon film 33, then as shown in FIG. 4(J), sidewalls 38 are formed on the side faces of the electrodes, and high concentration regions (N$^+$ and P$^+$) for leading out electrodes are formed by ion implantation. Further, emitters 39 are formed by subjecting the substrate to a heat treatment and letting impurities diffuse into the bases 28 and 30 from the polysilicon film 33.

In the manufacturing method in this embodiment, the p-type base region 28 of the NPN and the temporary p-type base region 30 of the V-PNP are formed by using the mask 21 same as that used in the formation of the n-type collector region 24 of the NPN and the n-type isolation region 26 of the V-PNP, and the n-type base region 34 of the V-PNP is formed by using the mask 31 same as that used in the formation of the p-type collector region 32 of the V-PNP.

In other words, according to the manufacturing method of this embodiment, the prescribed semiconductor device can be formed by using a smaller number of masks.

Embodiment 2

Now, in Embodiment 1, the p-type collector region (V-PW) 32 (see, FIG. 3(G)) of the V-PNP is electrically isolated from the p-type substrate 12 by the n-type isolation region (BW) 26 (see, FIG. 2(E)) formed simultaneous with the n-type collector region (BW) 24 of the NPN.

Following that, as shown in FIG. 2(F), in order not to increase the number of masks, the p-type base region (P-Base) 28 of the NPN is formed by an ion implantation using the same mask 21 as that shown in FIG. 2(E). As a result, a p-type base region (P-Base) 30 which is unnecessary is formed in the V-PNP.

Accordingly, after the formation of the p-type collector region (V-PW) 32 of the V-PNP, the temporary p-type base region (P-Base) 30 of the V-PNP is converted into the n-type base region (N-Base) 34 by performing an ion implantation of an n-type impurity, the so-called inverse ion implantation, using the same mask 31 employed in the preceding step, as shown in FIG. 3(H).

Since in the method of Embodiment 1, the n-type isolation region 26 and the n-type base region (N-Base) 34 of the V-PNP are formed by the above processes, there arise the following problems.

First, it is difficult to control as desired the peak impurity concentration of the n-type base region of the V-PNP which affects significantly the transistor characteristics.

Figure 5:
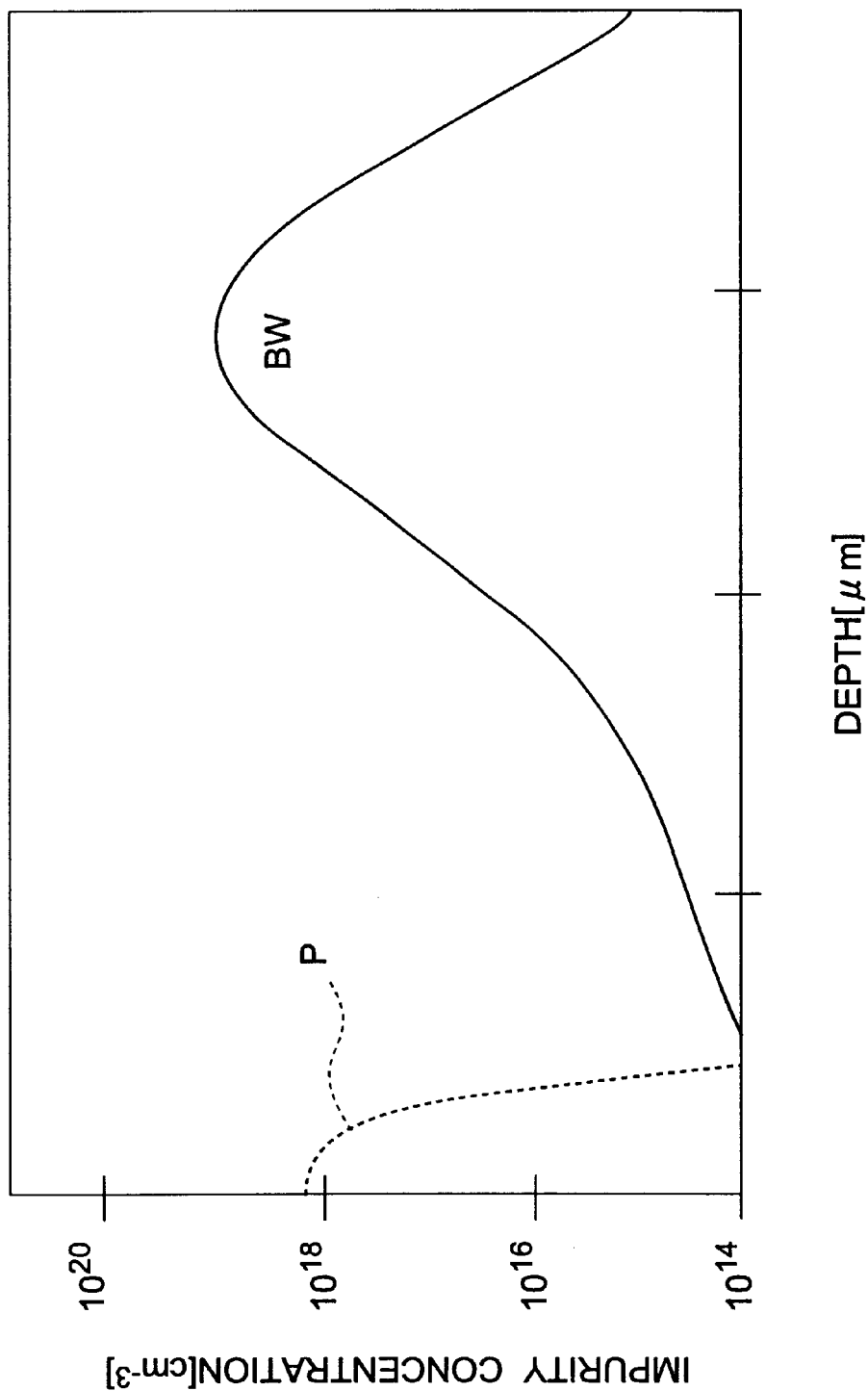
FIG. 5 is a graph showing the profile of the impurity concentration of the p-type base region and the n-type isolation region.

The impurity concentrations of the p-type base region 30 and the n-type region (BW) 26 directly below the emitter at the stage of formation of the temporary p-type base region 30 after the formation of the n-type isolation region 26 of the V-PNP have profiles as shown in FIG. 5. It shows the impurity concentration distributions along the line I—I in FIG. 2(F).

Figure 6:
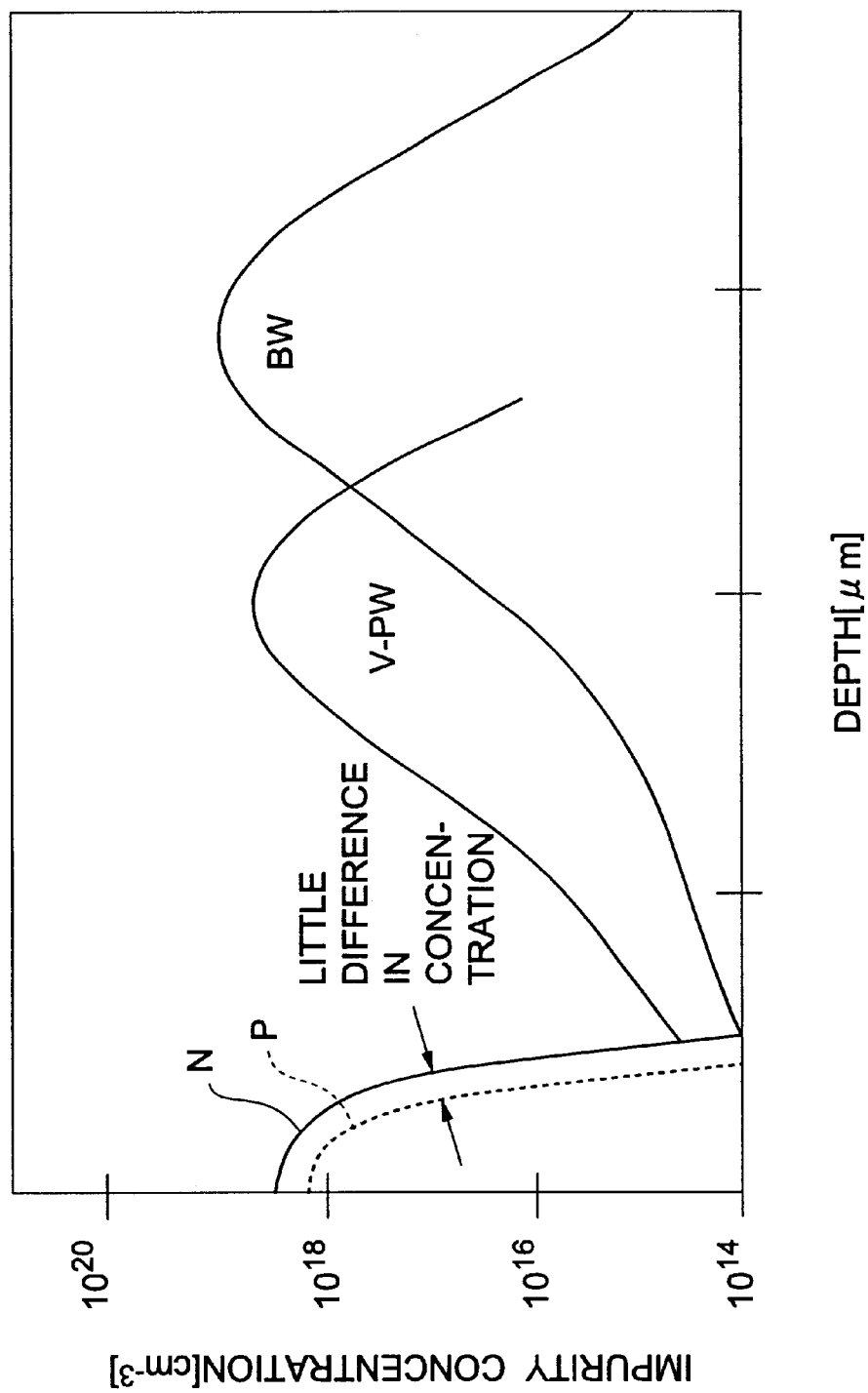
FIG. 6 is a graph showing the profile of the impurity concentration of the n-type base region, p-type collector region, and n-type isolation region.

The impurity concentrations in respective regions directly below the emitter at the stage where the p-type base region (P-Base) 30 of the V-PNP is converted to the n-type base region (N-Base) 34 of the V-PNP following the formation of the p-type collector region (V-PW) 32 have profiles as shown in FIG. 6. It shows the impurity concentration distributions along the line II—II in FIG. 3(h).

As shown in FIG. 6, both of the p-type impurity concentration of the p-type base region and the n-type impurity concentration of the n-type base region have very high values of the order of $10^{18}$ cm$^{-3}$, and moreover, there is hardly any difference in the concentrations of the p-type and n-type impurities. Because of this, it is very difficult to control the ion implantation of the n-type impurity so as to convert the p-type base region (P-Base) 30 to an n-type base region (N-Base) 34 having a predetermined peak impurity concentration by the ion implantation of the n-type impurity.

As a result, the n-type impurity concentration of the n-type base region (N-Base) 34 is not fixed at a constant level and has a dispersion, which leads to dispersions in the transistor characteristics such as the current amplification coefficient ($h_{FE}$), cut-off frequency ($f_T$), breakdown strength, and the like, making it difficult to obtain transistors with stabilized characteristics.

Second, due to the necessity of strictly controlling the distance in the depth direction of the p-type collector region (V-PW) of the V-PNP, the margin in the manufacture is decreased.

The collector region 32 of the V-PNP is electrically isolated from the p-type substrate 12 by the n-type region (BW) 26 formed simultaneously with the n-type collector region (BW) 24 of the NPN by the ion implantation. The profile of the impurity concentration of the n-type collector region (BW) 24 of the NPN cannot be changed freely because it affects the transistor characteristics such as the collector resistance. Consequently, the concentration profile of the n-type region (BW) 26 cannot be changed freely either.

Figure 7:
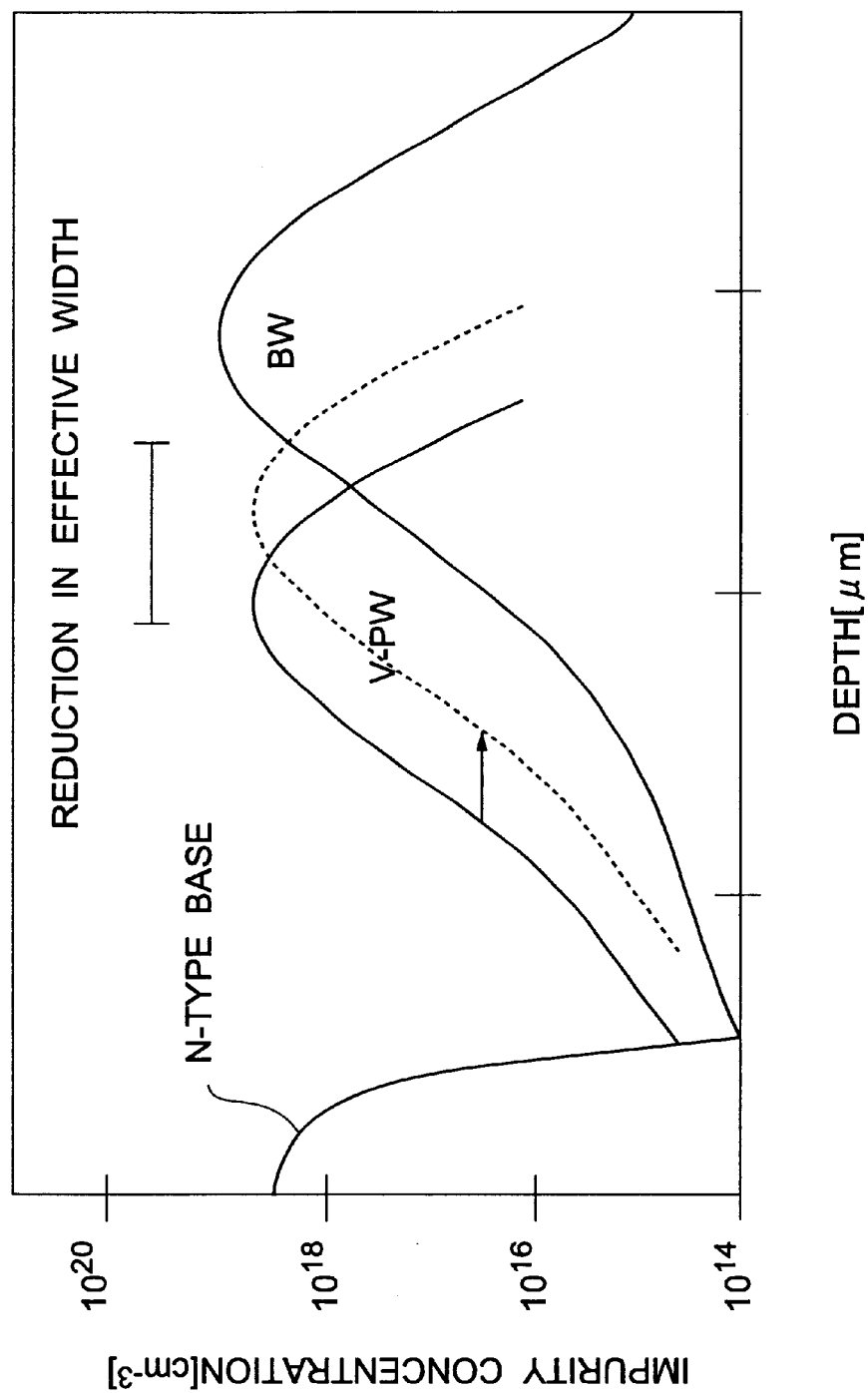
FIG. 7 is a graph showing the profile of the impurity concentration of the n-type base region, p-type collector region, and n-type isolation region, for the case when the depth of the p-type collector region is large.

As a result, if the p-type collector region (V-PW) of the V-PNP is extended to a large depth, the p-type collector region 32 overlaps with the n-type isolation region (BW) 26 which is expected to function as an isolator, and the effective width of the p-type collector region is decreased as shown ill FIG. 7, resulting in a large collector resistance and deterioration in the breakdown strength between the n-type isolation region (BW) 26 and the n-type base region (N-Base) 34.

Figure 8:
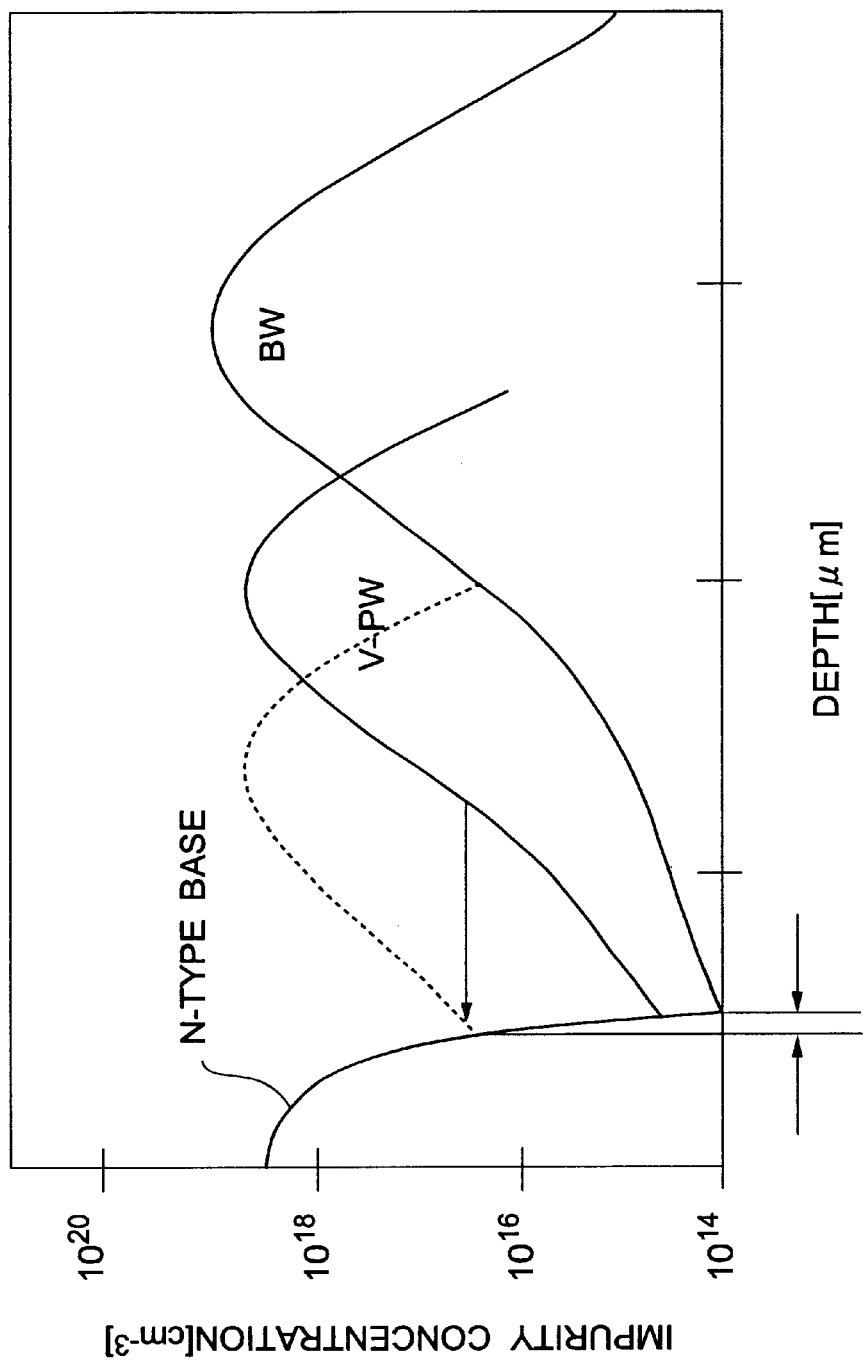
FIG. 8 is a graph showing the profile of the impurity concentration of the n-type base region, p-type collector region, and n-type isolation region, for the case when the depth of the p-type collector region is small.

On the contrary, if the depth of the p-type base region (V-PW) 32 of the V-PNP is small, the base-collector junction strength is deteriorated and a punch-through tends to occur, although the collector resistance is decreased due to narrowing of the width of the n-type base region (N-Base) 34, as shown in FIG. 8.

Accordingly, in the formation of the p-type collector region (V-PW) 32, because of the sharing of the n-type well, an attempt to set a large margin for the depth suffers from a heavy restriction due to the above reasons.

FIG. 7 and FIG. 8 are graphs showing the impurity concentration distributions taken along the line II—II of FIG. 3(H) the same as in FIG. 6.

Although the above problem can be resolved by ion implantations of the n-type isolation region and the n-type base region of the V-PNP using separate masks, it leads to an added cost in the manufacture because of the increase in the number of masks. The second method of the invention is devised to solve the above problem without increasing the number of masks. Referring to Embodiment 2, the second method of the invention will be described in detail.

Figure 9:
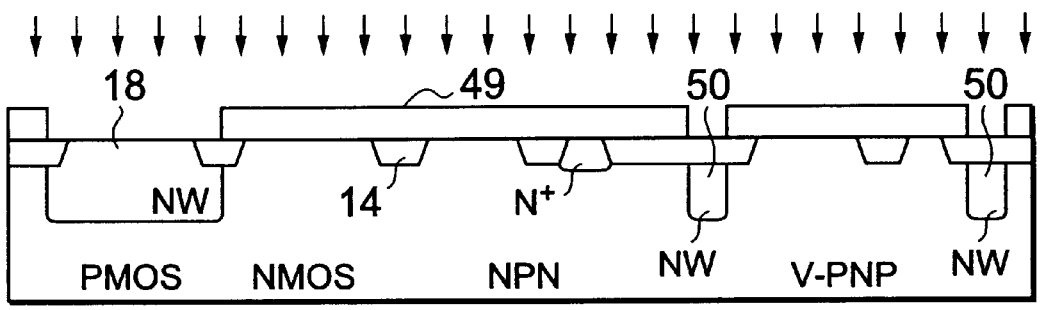
FIGS. 9(A), (B) and (C) illustrate the cross-sectional views of the layer structure of respective steps in the manufacture of the semiconductor device according to a second embodiment of the invention.
Figure 9:
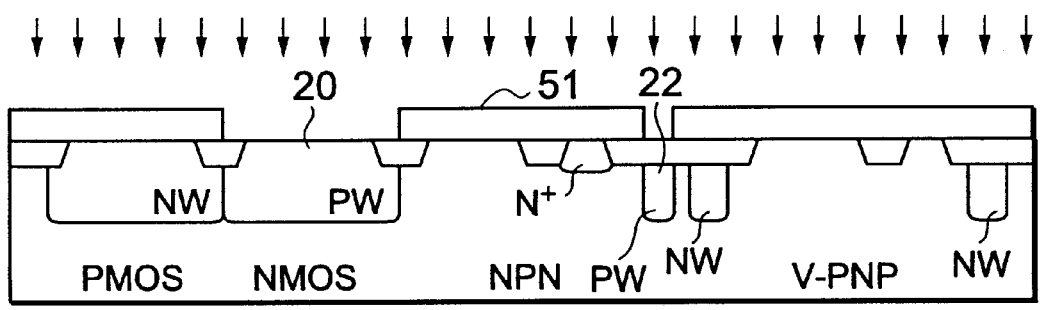
Figure 9:
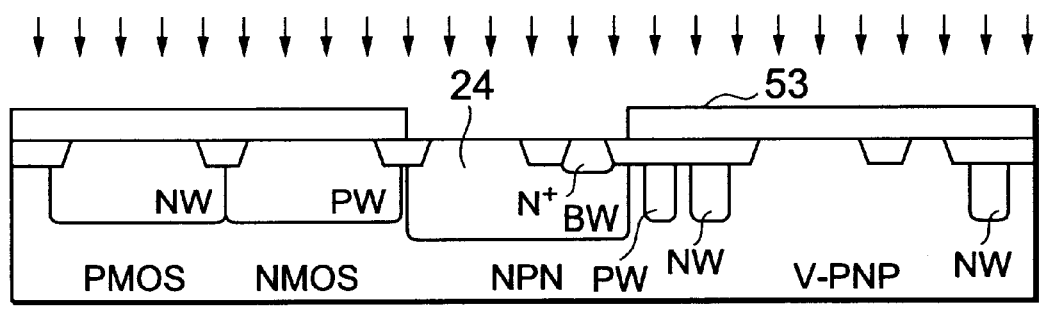
Figure 10:
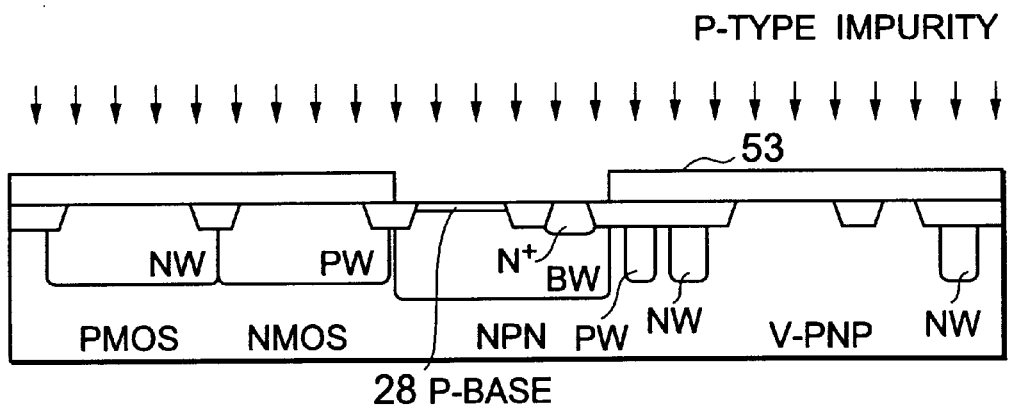
FIGS. 10(D), (E) and (F) illustrate the cross-sectional views of the layer structure of respective steps in the manufacture of the semiconductor device according to the second embodiment of the invention, consecutive to FIG. 9.
Figure 10:
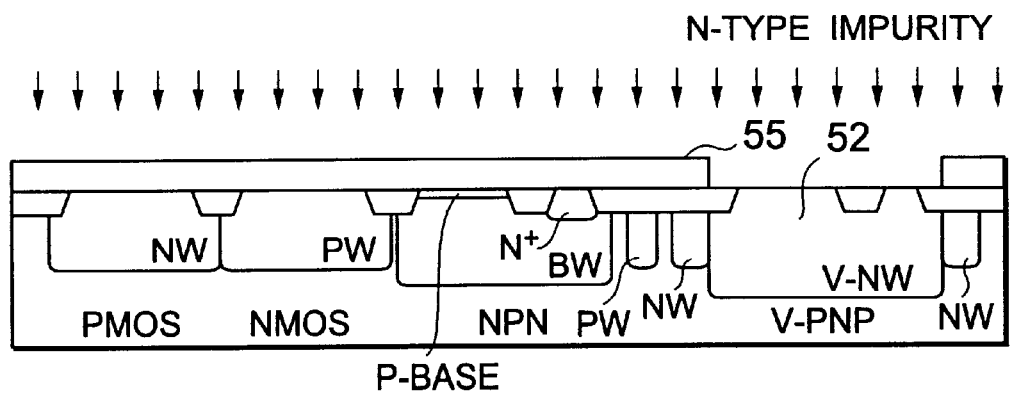
Figure 10:
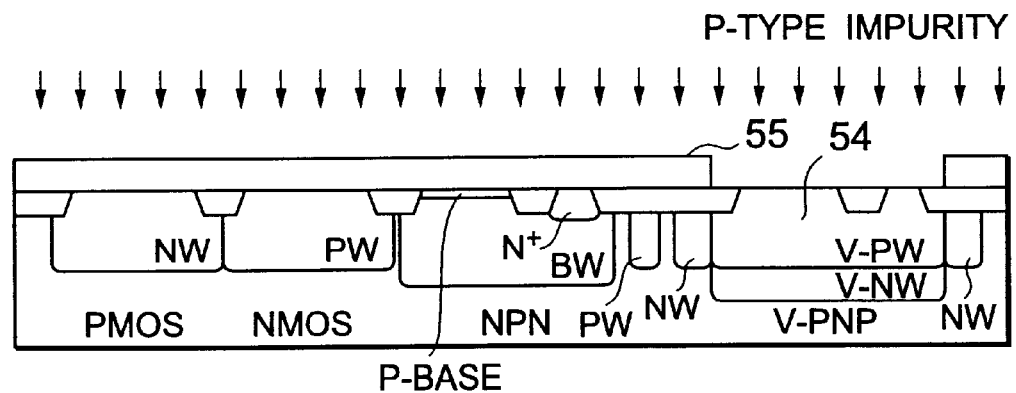
Figure 11:
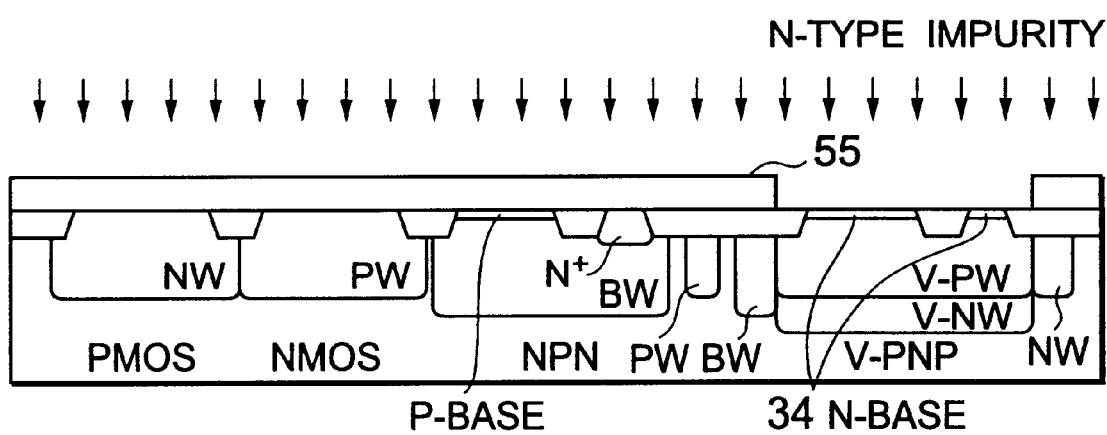
FIG. 11 illustrates the cross-sectional views of the layer structure of respective steps in the manufacture of the semiconductor device according to the second embodiment of the invention, consecutive to FIG. 10.

FIG. 9 to FIG. 11 illustrate the sectional views of the layer structure for respective steps in the manufacture of the semiconductor device according to the present embodiment.

In this embodiment, first, an element isolation film 14 for mutually isolating PMOS, NMOS, NPN, and V-PNP is provided by forming a silicon oxide film in a silicon substrate 12, then a lead-out region 16 of an n-type electrode of the NPN is formed to obtain a substrate having the layer structure as shown in FIG. 1(B) similar to Embodiment 1.

Next, as shown in FIG. 9(A), a mask 49 of photoresist film is formed, and an n-type well region (NW) 18 of the PMOS and an n-type annular isolation region (NW) 50 of the V-PNP are formed simultaneously by implanting ions of an n-type impurity with energy of 600 to 800 keV at a dose of $1 \times 10^{13}$ to $1 \times 10^{14}$ cm$^{-2}$.

Next, as shown in FIG. 9(B), a mask 51 of photoresist film is formed, and a p-type well region (PW) 20 of the NMOS and a well region (PW) 22 for insulating the NPN from the V-PNP are formed simultaneously by implanting a p-type impurity with energy of 100 to 300 keV at a dose of $1 \times 10^{13}$ to $1 \times 10^{14}$ cm$^{-2}$.

Next, as shown in FIG. 9(C), a mask 53 of photoresist film is formed, and an n-type collector region (BW) 24 of the NPN is formed by implanting ions of phosphorus, as an n-type impurity, with energy of 1000 keV at a dose of $3.0 \times 10^{13}$ cm$^{-2}$.

Next, as shown in FIG. 10(D), a p-type base region (P-Base) 28 of the NPN is formed by implanting ions of boron or $BF_2$, as a p-type impurity, with energy that prevents the ions from penetrating the element isolation region 14 at a dose of $2 \times 10^{13}$ to $4 \times 10^{13}$ cm$^{-2}$.

Next, as shown in FIG. 10(E), a mask 55 of photoresist film is formed, and an n-type lower isolation region (V-NW) 52 of the V-PNP is formed in a region including an n-type collector formation region and a region further below by implanting ions of phosphorus, as an n-type impurity, with energy of 1300 keV at a dose of $1.5 \times 10^{13}$ cm$^{-2}$.

Next, as shown in FIG. 10(F), a p-type collector region 54 of the V-PNP is formed by implanting ions of boron, as a p-type impurity, with energy of 400 keV at a dose of $3.0 \times 10^{13}$ cm$^{-2}$ using the same mask 55 as that shown in FIG. 10(E).

Following that, as shown in FIG. 11, an n-type base region (N-Base) 34 of the V-PNP is formed by implanting ions of phosphorus, as an n-type impurity, with energy of 140 keV at a dose of $6.0 \times 10^{12}$ cm$^{-2}$ using the same mask 55 as that shown in FIG. 10(E).

Next, an electrode lead-out region, a gate electrode, an emitter electrode, an emitter and the like are formed in the same way as Embodiment 4 that will be described later.

In this embodiment, since the n-type lower isolation region 52 and then the p-type collector region 54 of the V-PNP are formed respectively independent of other impurity regions analogous to Embodiment 1, it is possible to freely control the depth of the n-type lower isolation region 52 and the p-type collector region 54 of the V-PNP. In addition, since the n-type base region 34 of the V-PNP is formed independently rather than by an inverse ion implantation, it is possible to control the peak concentration of the impurity exactly as desired, and hence to optimize the electrical characteristics of the V-PNP independent from the NPN.

In the formation of the impurity regions, the number of masks required in Embodiment 2 is five of masks 15, 49, 51, 53, and 55 which is the same in number as five of masks 15, 17, 19, 21, and 31 that are required in Embodiment 1.

Embodiment 3

In Embodiment 2, the n-type isolation region (NW) 50 of the V-PNP is formed utilizing the ion implantation in the CMOS process, but with this arrangement it cannot be formed at a sufficiently deep position. Accordingly, in order to form an n-type isolation region at a sufficiently large depth it is preferable to form an n-type isolation region 40 (to be described later) utilizing an ion implantation at the time of formation of the n-type collector of the NPN.

Figure 12:
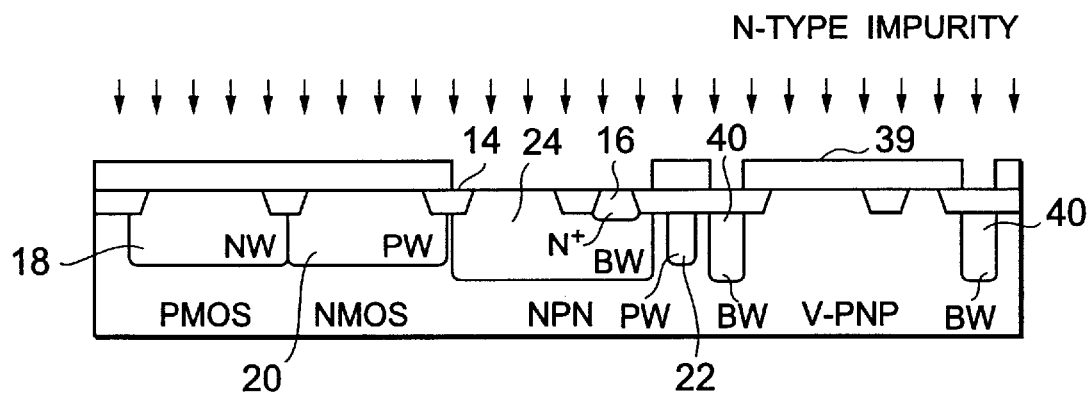
FIGS. 12(A), (B) and (C) illustrate the cross-sectional views of the layer structure of respective steps in the manufacture of the semiconductor device according to a third embodiment of the invention.
Figure 12:
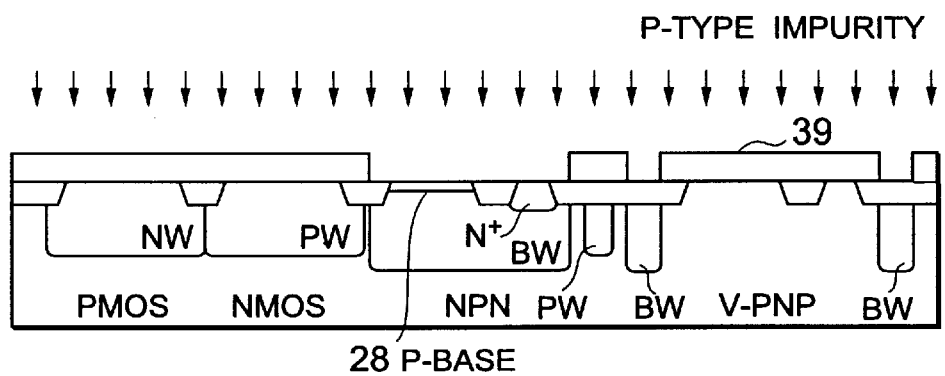
Figure 12:
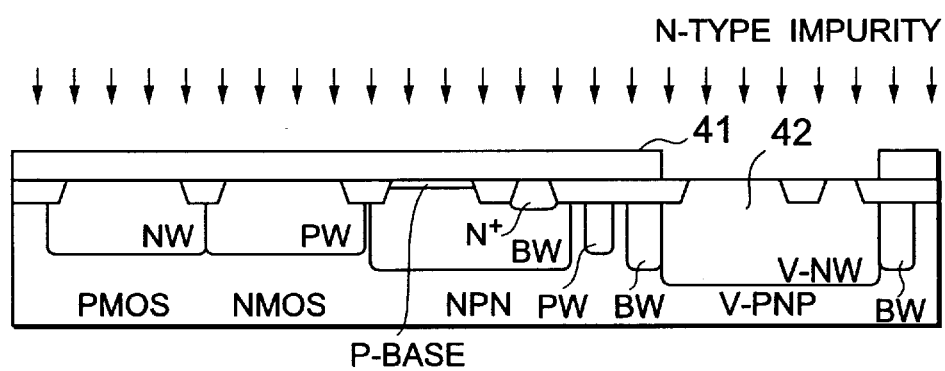

The present embodiment is another example of embodiment of the manufacturing method of the semiconductor device according to the second method of the invention, by which the n-type isolation region 40 is formed by utilizing the ion implantation at the time of formation of the n-type collector region of the NPN. FIG. 12 to FIG. 14 illustrate the sectional views of the layer structure for respective steps in the manufacture of the semiconductor device according to the manufacturing method of this embodiment.

In this embodiment, first, an element isolation region 14 for isolating PMOS, NMOS, NPN, and V-PNP is provided by forming a silicon oxide film 14 in a silicon substrate 12 in the same way as in Embodiment 1.

Next, analogous to Embodiment 1, a substrate having the layer structure as shown in FIG. 2(D) of Embodiment 1 is obtained by forming an n-type collector electrode lead-out region 16 of the NPN, an n-type well region (NW) 18 of the PMOS, a p-type well region (PW) 20 of the NMOS, and a well region (PW) 22 for insulating the NPN from the V-PNP.

Figure 15:
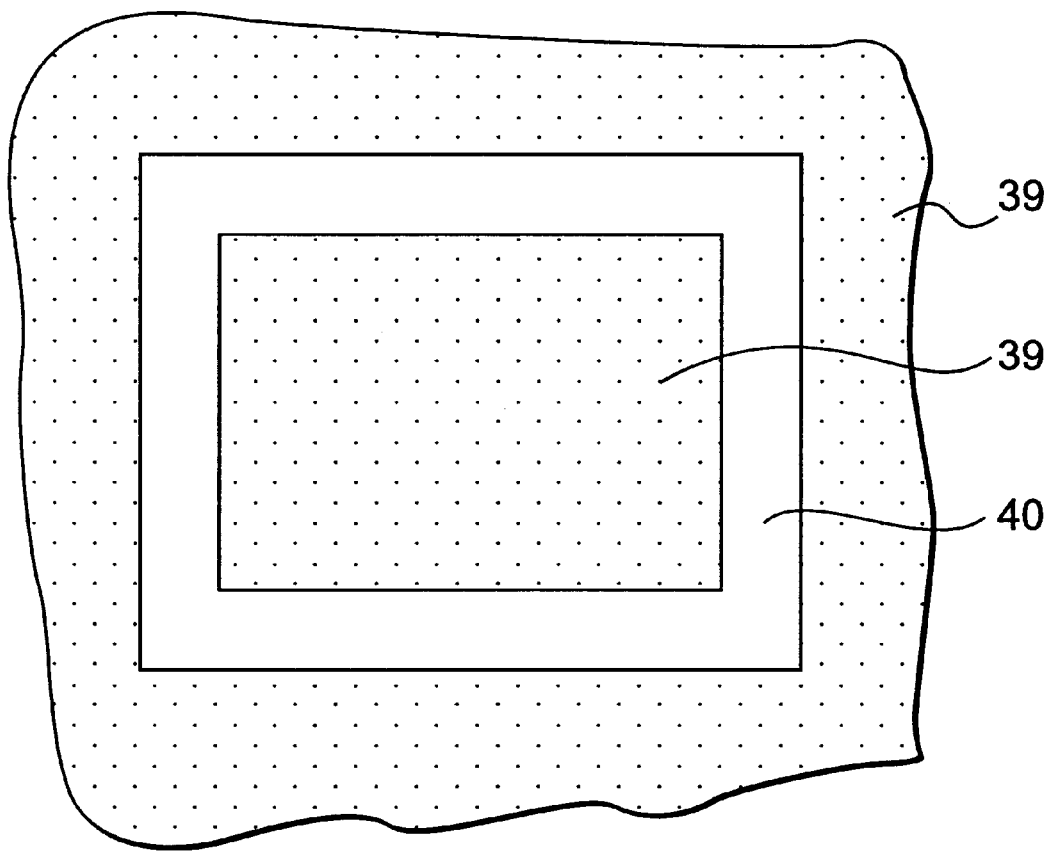
FIG. 15 is a plan view of the annular isolation region.

Next, as shown in FIG. 12(A), a mask 39 of photoresist film is formed, and an n-type collector region (BW) 24 of the NPN and a lateral isolation region, namely, an n-type annular isolation region (BW) 40 of the V-PNP are formed simultaneously by implanting ions of phosphorus, as an n-type impurity, with energy of 1000 keV at a dose of $1 \times 10^{13}$ to $5 \times 10^{13}$ cm$^{-2}$. The plan view of the n-type annular isolation region (BW) 40 is that of a rectangular annular region as shown in FIG. 15.

Next, as shown in FIG. 12(B), a p-type base region (P-Base) 28 is formed by implanting ions of boron or BF$_2$, as a p-type impurity, with energy which prevent the ions from penetrating the element isolation region 14 at a dose of $1 \times 10^{13}$ to $4 \times 10^{13}$ cm$^{-2}$ using the same mask 39 as that shown in FIG. 12(A).

Next, as shown in FIG. 12(C), a mask 41 of photoresist film is formed, and an n-type lower isolation region (V-NW) 42 is formed in a region including an n-type collector formation region and a region further below by implanting ions of phosphorus, as an n-type impurity, with energy of 1300 keV at a dose of $1 \times 10^{13}$ to $5 \times 10^{13}$ cm$^{-2}$.

Figure 13D:
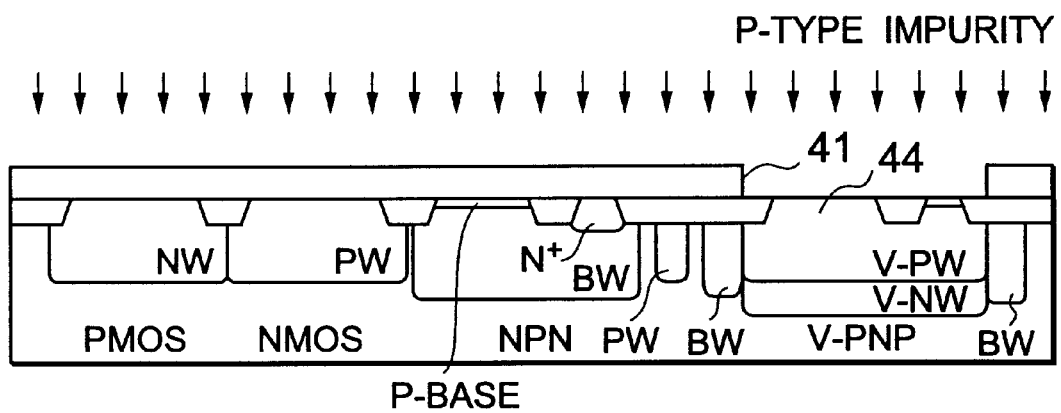
FIGS. 13(D) and (E) illustrate the cross-sectional views of the layer structure of respective steps in the manufacture of the semiconductor device according to the third embodiment of the invention, consecutive to FIG. 12.
Figure 14:
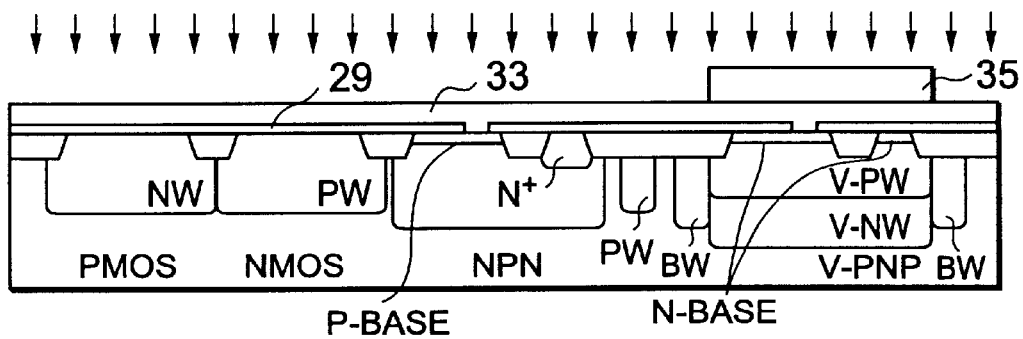
FIGS. 14(F) and (G) illustrate the cross-sectional views of the layer structure of respective steps in the manufacture of the semiconductor device according to the third embodiment of the invention, consecutive to FIG. 13.
Figure 14:
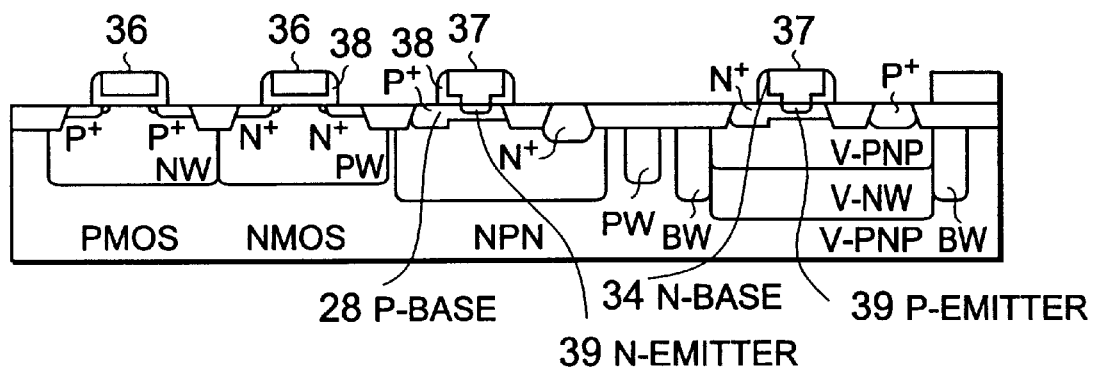

Next, as shown in FIG. 13(D), a p-type collector region 44 is formed above the n-type lower isolation region 42 of the V-PNP by implanting ions of boron, as a p-type impurity, with energy of 400 keV at a dose of $3.0 \times 10^{13}$ cm$^{-2}$.

Figure 13E:
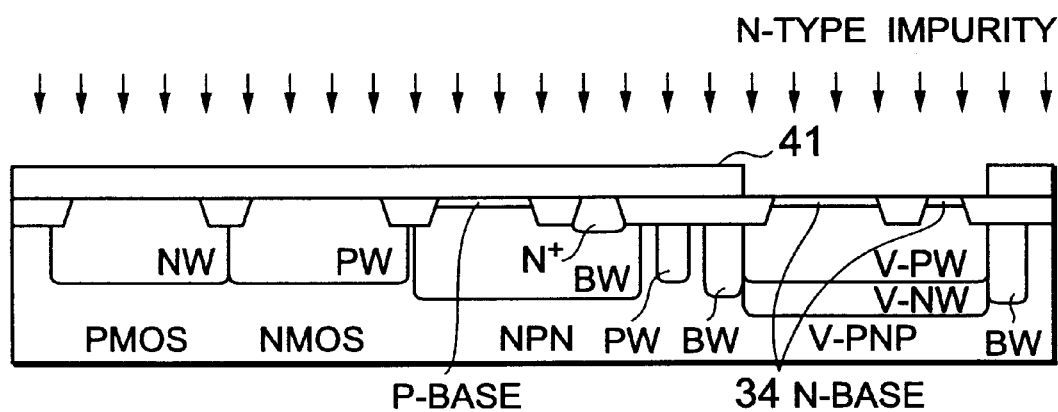

Following that, as shown in FIG. 13(E), an n-type base region (N-Base) 34 of the V-PNP is formed by implanting ions of phosphorus, as an n-type impurity, with energy of 140 keV at a dose of $6.0 \times 10^{12}$ cm$^{-2}$ using the same mask as that shown in FIG. 12(C).

Next, as shown in FIG. 14(F), a gate oxide film 29 is formed, emitter contacts of the NPN and the V-PNP are opened in the gate oxide film 29, and a polysilicon film 33 is formed on the entire surface of the substrate. Following that, a mask 35 is formed on the V-PNP formation region, and a high concentration n-type impurity is implanted to the polysilicon film 33 other than the region of the V-PNP formation.

Following that, a mask with opening for the V-PNP formation region is formed on the entire surface of the substrate, and a high concentration p-type impurity is implanted to the V-PNP formation region of the polysilicon film 33, although not shown. Then, the substrate is subjected to a heat treatment to cause the diffusion of the impurity ion implanted into the polysilicon film 33.

Next, as shown in FIG. 14(G), gate electrodes 36 of the PMOS and the NMOS and emitter electrodes 37 of the NPN and the V-PNP are formed by patterning the polysilicon film 33, then sidewalls 38 are formed on the side faces of the electrodes, and high concentration regions (N$^+$ and P$^+$) for leading-out the electrodes are formed by ion implantation. Further, the substrate is subjected to a heat treatment to form emitters 39 by letting the impurities diffuse from the polysilicon film 33 into the bases regions 28 and 34.

In this embodiment, since the n-type lower isolation region 42, then the p-type collector region 44 of the V-PNP are respectively formed separately in a manner independent of the other impurity regions, the depths of the n-type lower isolation region 42 and the p-type collector region 44 can be controlled freely.

Moreover, since the n-type base region 34 is formed independently rather than by a reverse ion implantation, the peak concentrations of the impurities can be controlled exactly as desired. As a result, the electrical characteristics of the V-PNP can be optimized independent of those of the NPN.

Further, in the formation of the impurity regions, the number of masks required in Embodiment 3 is five of the masks 15, 17, 19, 39, and 41 which is equal in number to the five masks 15, 17, 19, 21, and 31 required in Embodiment 1.

Embodiment 4

Figure 16:
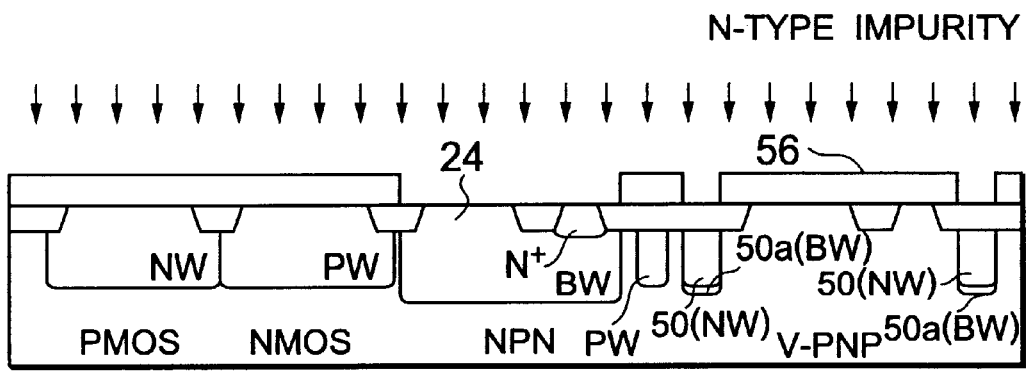
FIGS. 16(A), (B) and (C) illustrate the cross-sectional views of the layer structure of respective steps in the manufacture of the semiconductor device according to a fourth embodiment of the invention.
Figure 16:
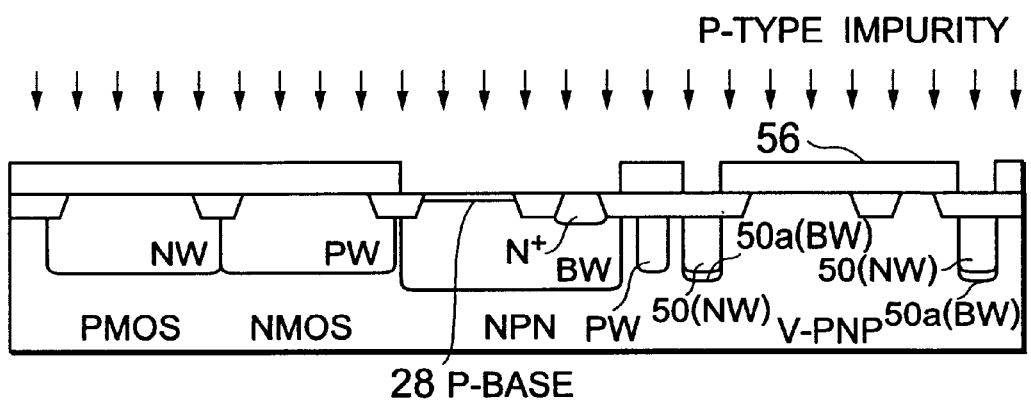
Figure 16:
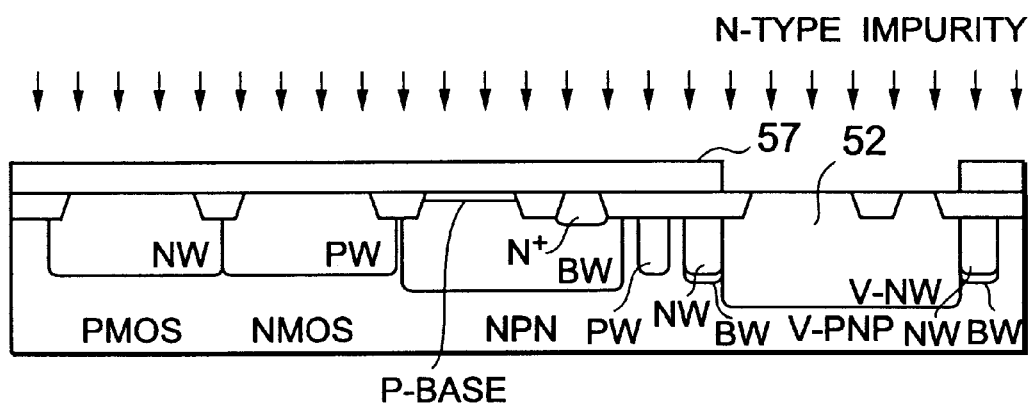

This embodiment is a still another example of embodiment of the second manufacturing method according to this invention. FIGS. 16 to 18 illustrate sectional views of the layer structure for respective steps in the manufacture of the semiconductor device according to the manufacturing method of this embodiment.

In Embodiment 3, the n-type annular isolation region of the V-PNP is formed by an ion implantation simultaneous with the formation of the n-type well region of the PMOS. In this embodiment, however, a two stage n-type annular isolation region is formed by ion implantations simultaneous with respective formations of an n-type well region of the PMOS and an n-type collector region of the NPN.

In this embodiment, first, analogous to Embodiment 3, an element isolation region 14 for mutually isolating the PMOS, NMOS, NPN, and V-PNP is provided by forming a silicon oxide film in a silicon substrate 12, then an n-type collector electrode lead-out region 16 is formed.

Then, an n-type well region (NW) 18 of the PMOS and an n-type annular isolation region (NW) 50 of the V-PNP are formed simultaneously. Following that, a p-type well region (PW) 20 of the NMOS and a well region (PW) 22 for isolating the NPN from the V-PNP are formed simultaneously to obtain a substrate having the layer structure as shown in FIG. 11(b) of Embodiment 3.

Next, as shown in FIG. 16(A), a mask 56 of photoresist film is formed, and an n-type collector region (BW) 24 of the NPN and a deep n-type annular isolation region (BW) 50a of the V-PNP, below and adjacent to the n-type annular isolation region (NW) 50, are formed by implanting ions of phosphorus, as an n-type impurity, with energy of 1000 keV at a dose of $3.0 \times 10^{13}$ cm$^{-2}$.

Next, as shown in FIG. 16(B), a p-type base region (P-Base) 28 of the NPN is formed by implanting ions of boron or BF$_2$, as a p-type impurity, with energy that prevents the ions from penetrating the element isolation region at a dose of $2 \times 10^{13}$ to $4 \times 10^{13}$ cm$^{-2}$ using the mask 56 the same as that shown in FIG. 16(A).

Next, as shown in FIG. 16(C), a mask 57 of photoresist film is formed, and an n-type lower isolation region (V-NW) 52 of the V-PNP is formed in a region including an n-type collector formation region and a region further below by implanting phosphorus, as an n-type impurity, with energy of 1300 keV at a dose of $1.5 \times 10^{13}$ cm$^{-2}$.

Figure 17D:
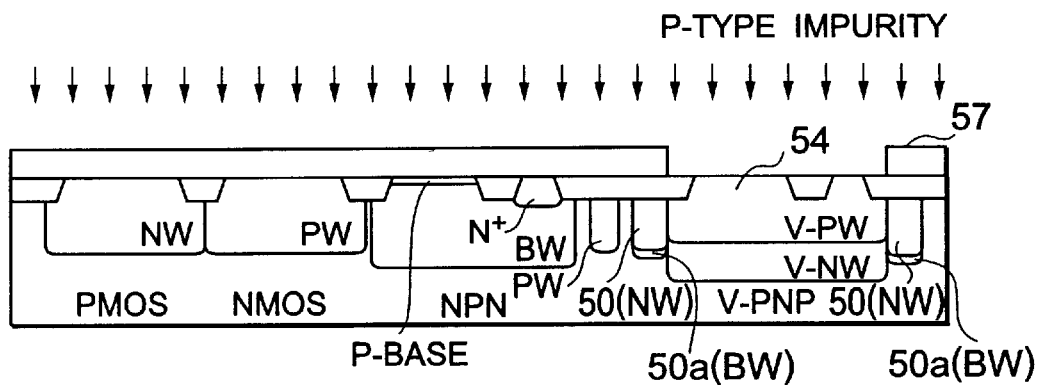
FIGS. 17(D), (E) and (F) illustrate the cross-sectional views of the layer structure of respective steps in the manufacture of the semiconductor device according to the fourth embodiment of the invention, consecutive to FIG. 16.

Next, as shown in FIG. 17(D), a p-type collector region 54 of the V-PNP is formed by implanting ions of boron, as a p-type impurity, with energy of 400 keV at a dose of $3.0 \times 10^{13}$ cm$^{-2}$ using the same mask 57 as shown in FIG. 16(c).

Figure 17E:
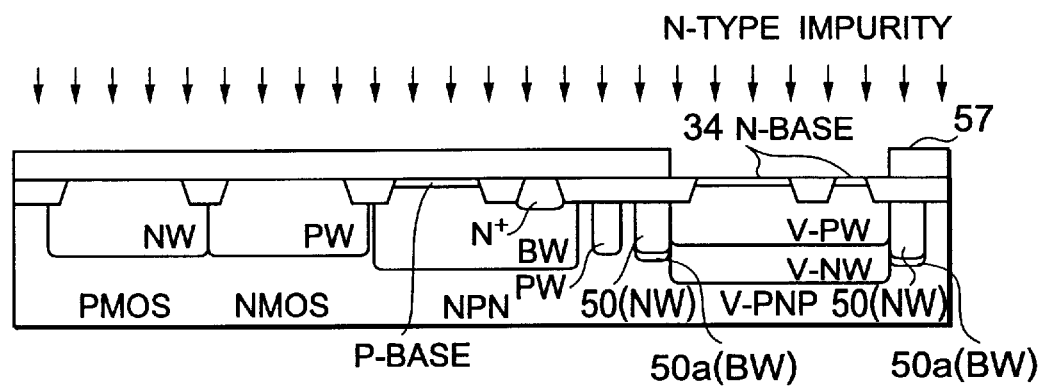

Next, as shown in FIG. 17(E), an n-type base region (N-Base) 34 of the V-PNP is formed by implanting ions of phosphorus, as an n-type impurity, with energy of 140 keV at a dose of $6.0 \times 10^{12}$ cm$^{-2}$ using the same mask 57 as shown in FIG. 16(C).

Figure 17F:
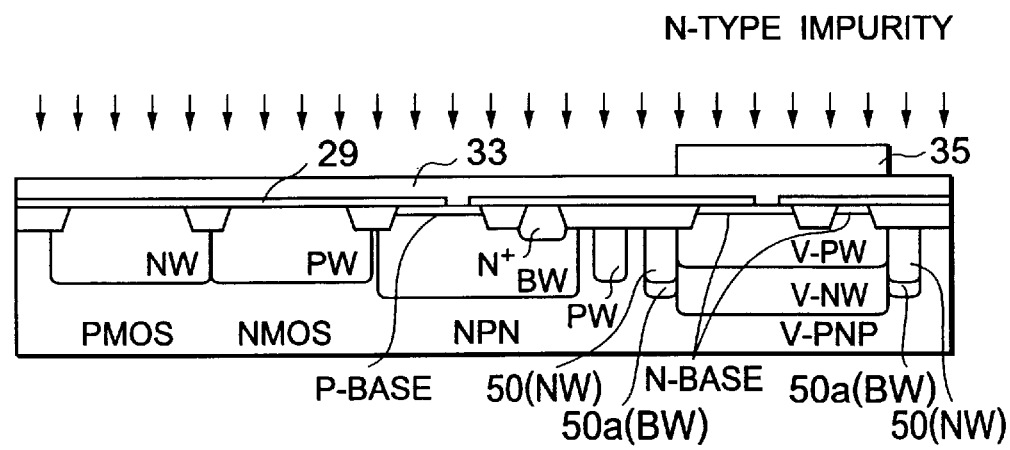

Next, as shown in FIG. 17(F), a gate oxide film 29 is formed, then emitter contacts for the NPN and V-PNP are opened in the gate oxide film 29, and a polysilicon film 33 is formed on the entire surface of the substrate. Following that, a mask 35 is formed on the V-PNP formation region and a high concentration n-type impurity is implanted into the region of the polysilicon film 33 other than the V-PNP formation region.

Figure 18G:
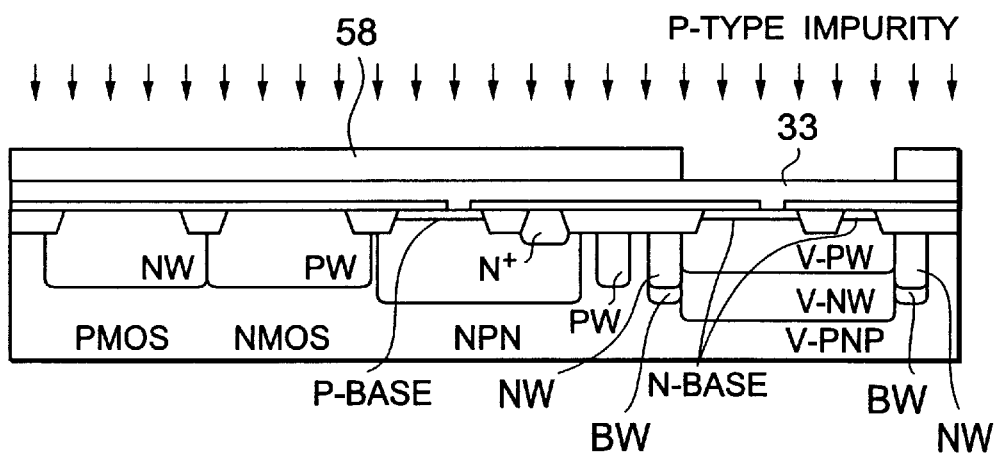
FIGS. 18(G), (H) and (I) illustrate the cross-sectional views of the layer structure of respective steps in the manufacture of the semiconductor device according to the fourth embodiment of the invention, consecutive to FIG. 17.

Following that, as shown in FIG. 18(G), a mask 58 with an opening on the V-PNP formation region is formed on the entire surface, and a high concentration p-type impurity is implanted into the V-PNP formation region of the polysilicon film 33. Next, the substrate is subjected to a heat treatment to let the implanted impurity ions diffuse in the polysilicon film 33.

Figure 18H:
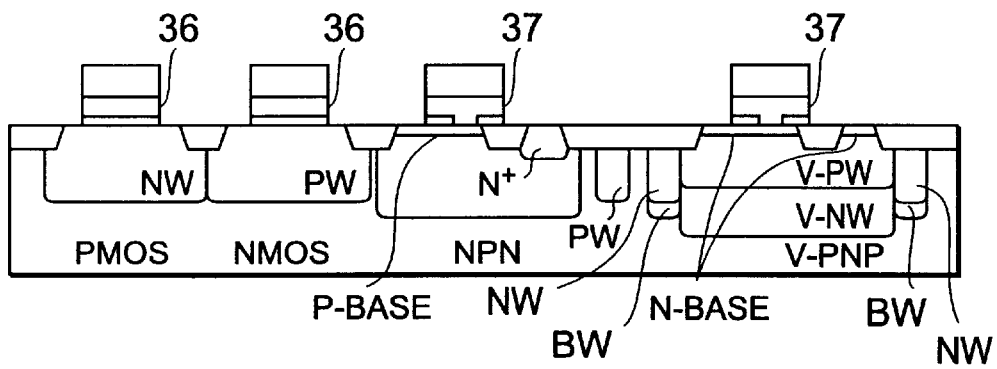
Figure 18I:
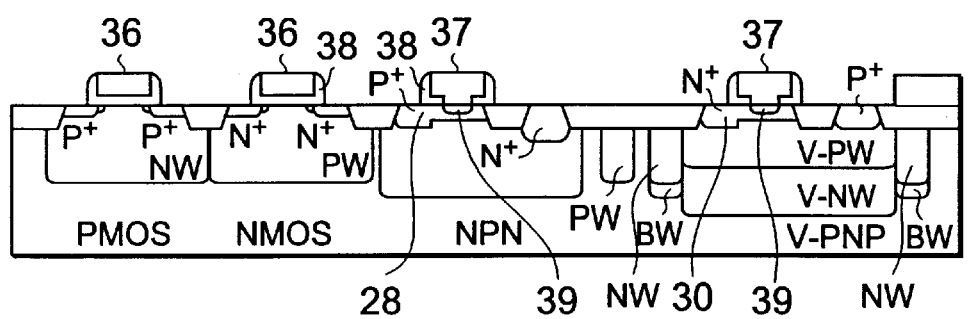

Next, as shown in FIG. 18(H), gate electrodes 36 of the PMOS and the NMOS and emitter electrodes 37 of the NPN and the V-PNP are formed by patterning the polysilicon film 33. Then, as shown in FIG. 18(I), sidewalls 38 are formed on the side faces of the electrodes, and high concentration regions (N$^+$ and P$^+$) for electrode lead-out are formed by ion implantation. In addition, the substrate is subjected to a heat treatment to form emitters 39 by letting impurities diffuse from the polysilicon film 33 to the bases 28 and 34.

Figure 19:
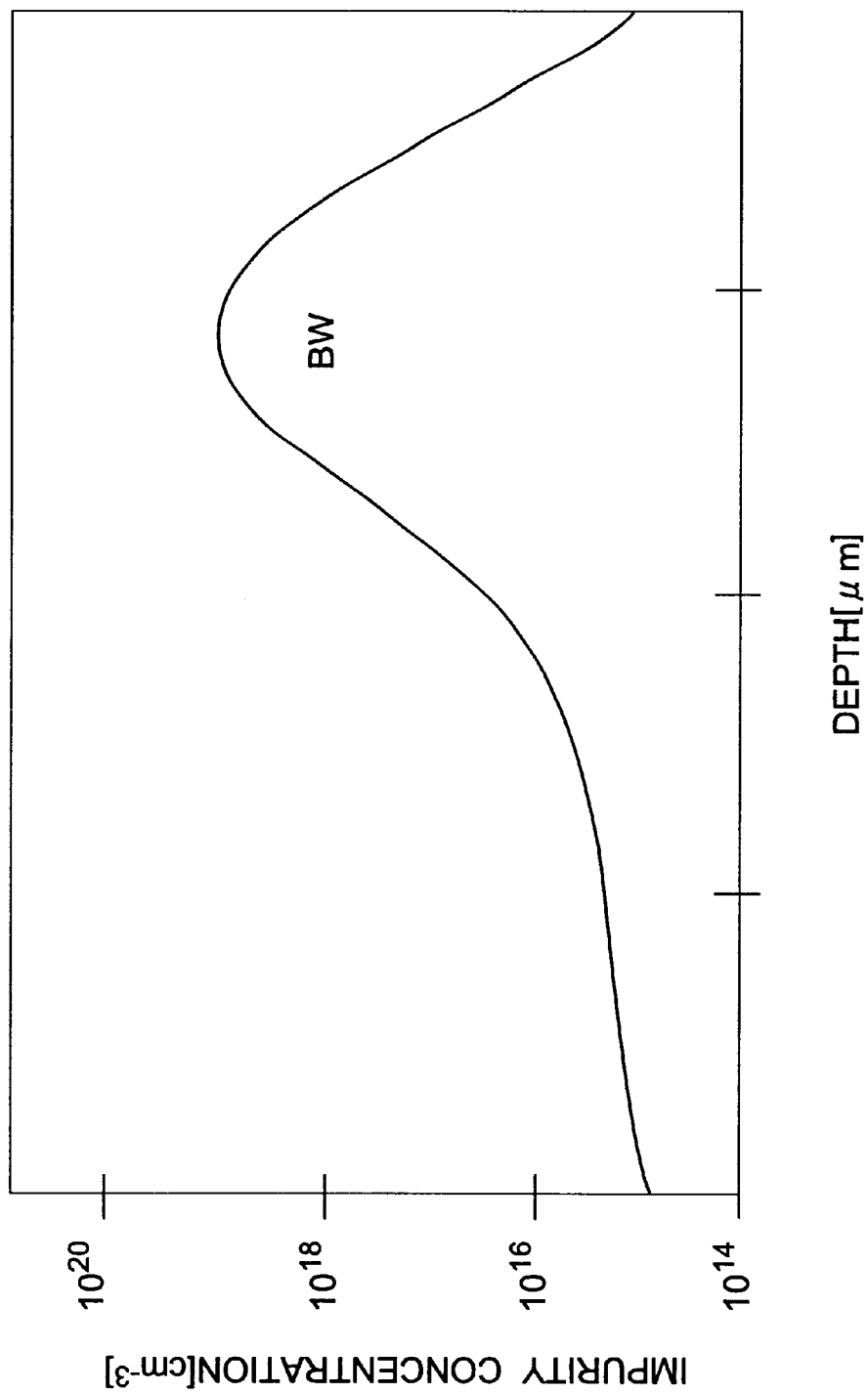
FIG. 19 is a graph showing the profile of the impurity concentration of the n-type annular isolation region in the third embodiment of the invention.

In Embodiment 3 where the n-type annular isolation region is formed at the same time as the formation of the n-type collector region of the NPN, the concentration profile of the n-type annular isolation region has a profile in which the impurity concentration is low in the shallow region as shown in FIG. 19. Accordingly, in Embodiment 3, it is necessary to increase the width of the annular isolation region in order to maintain the insulating property of the n-type annular isolation region.

Figure 20:
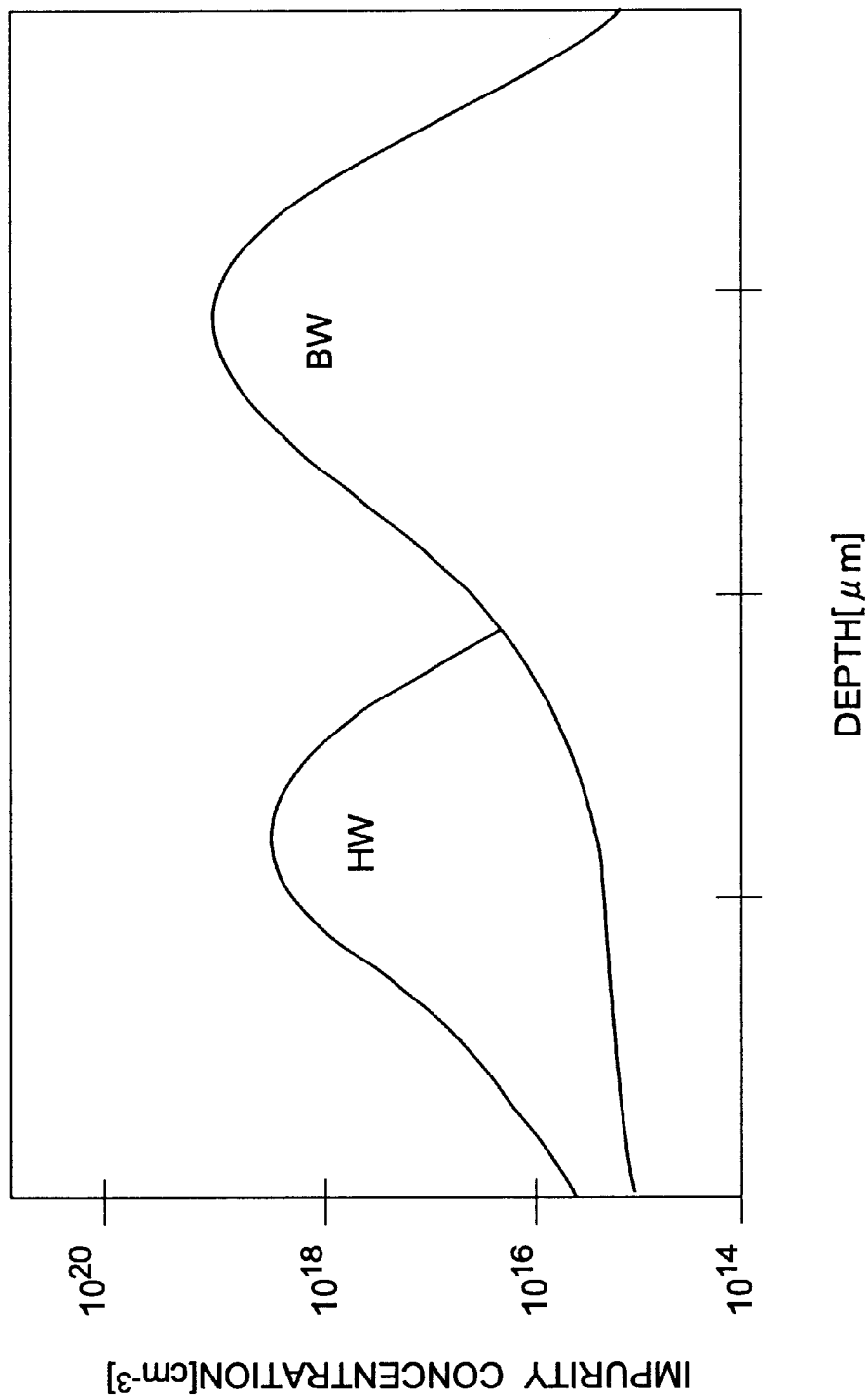
FIG. 20 is a graph showing the profile of the impurity concentration of the n-type annular isolation region of the fourth embodiment of the invention.

On the other hand, in Embodiment 4, first, the n-type annular isolation region (NW) 50 having a concentration peak at a shallow region is formed by ion implantation simultaneous with the formation of the n-type well region of the PMOS. Then, an n-type deep annular isolation region (BW) 50a having a concentration peak at a deep region is formed by the implantation of ions with energy higher than that at the formation of the n-type well of the PMOS. By so doing, the concentration profile of the n-type annular isolation region of this embodiment has peaks at a shallow region (NW) 50 and at a deep region (BW) 50a as shown in FIG. 20, so that the insulating property in the lateral direction of the annular isolation region is satisfactory over the entire depth of the n-type annular isolation region.

Figure 21:
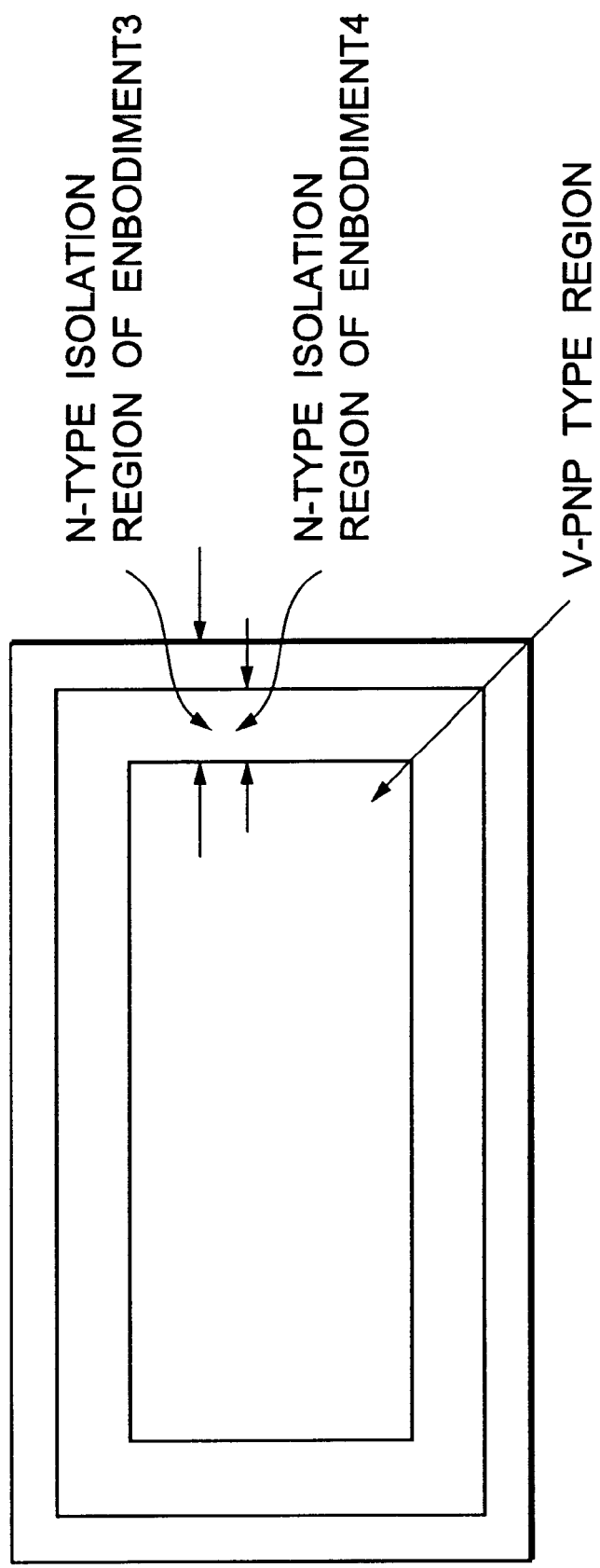
FIG. 21 is a plan view of the annular isolation region of the fourth embodiment of the invention.

Accordingly, as shown in FIG. 21, it is possible to decrease the width of the annular isolation region and reduce the required area of the n-type annular isolation region as a whole, contributing to the refinement of the semiconductor device.

In this embodiment, analogous to Embodiments 2 and 3, the n-type lower isolation region 52, then the p-type collector region 54 of the V-PNP are respectively formed separately and independent of the other impurity regions, so that the depth of the n-type lower isolation region 52 and the p-type collector region 54 of the V-PNP can be controlled freely. Moreover, since the n-type base region 34 of the V-PNP is formed independently rather than by reverse ion implantation and the peak concentration of the impurity can be controlled as desired, the electrical characteristics of the V-PNP can be optimized independent of those of the NPN.

In the formation of the impurity regions, the number of masks required in Embodiment 4 is five of masks 15, 49, 51, 56, and 57 which is the equal in number to the required five masks of 15, 17, 19, 21, and 31 in Embodiment 1.

Embodiment of the Semiconductor Device

Figure 22A:
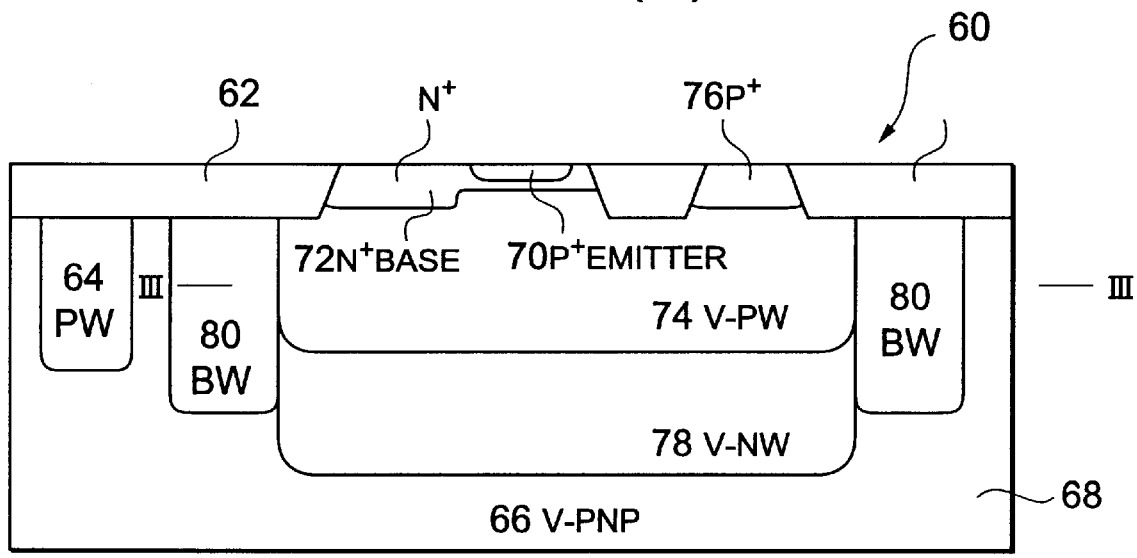
FIG. 22(A) shows the layer structure of the embodiments of the semiconductor device.
Figure 22B:
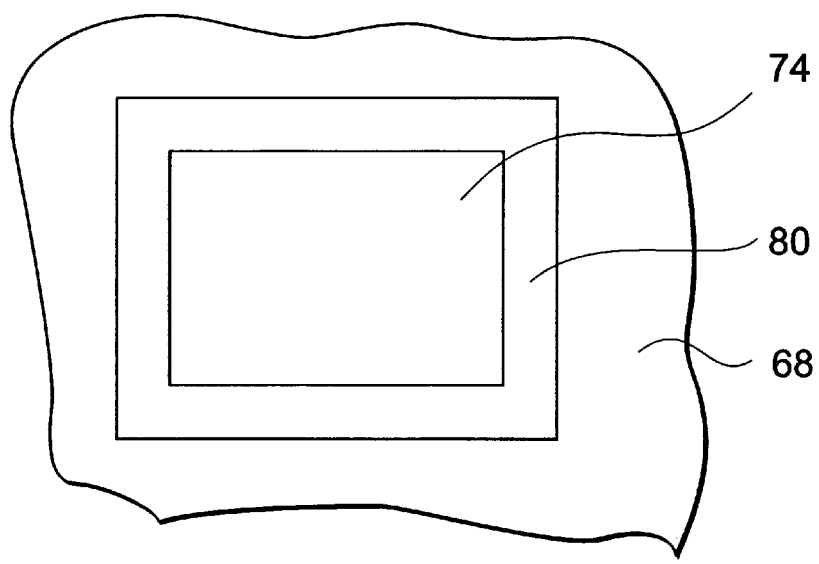
FIG. 22(B) is a schematic plan view showing the plane form of the n-type annular isolation region.
Figure 23:
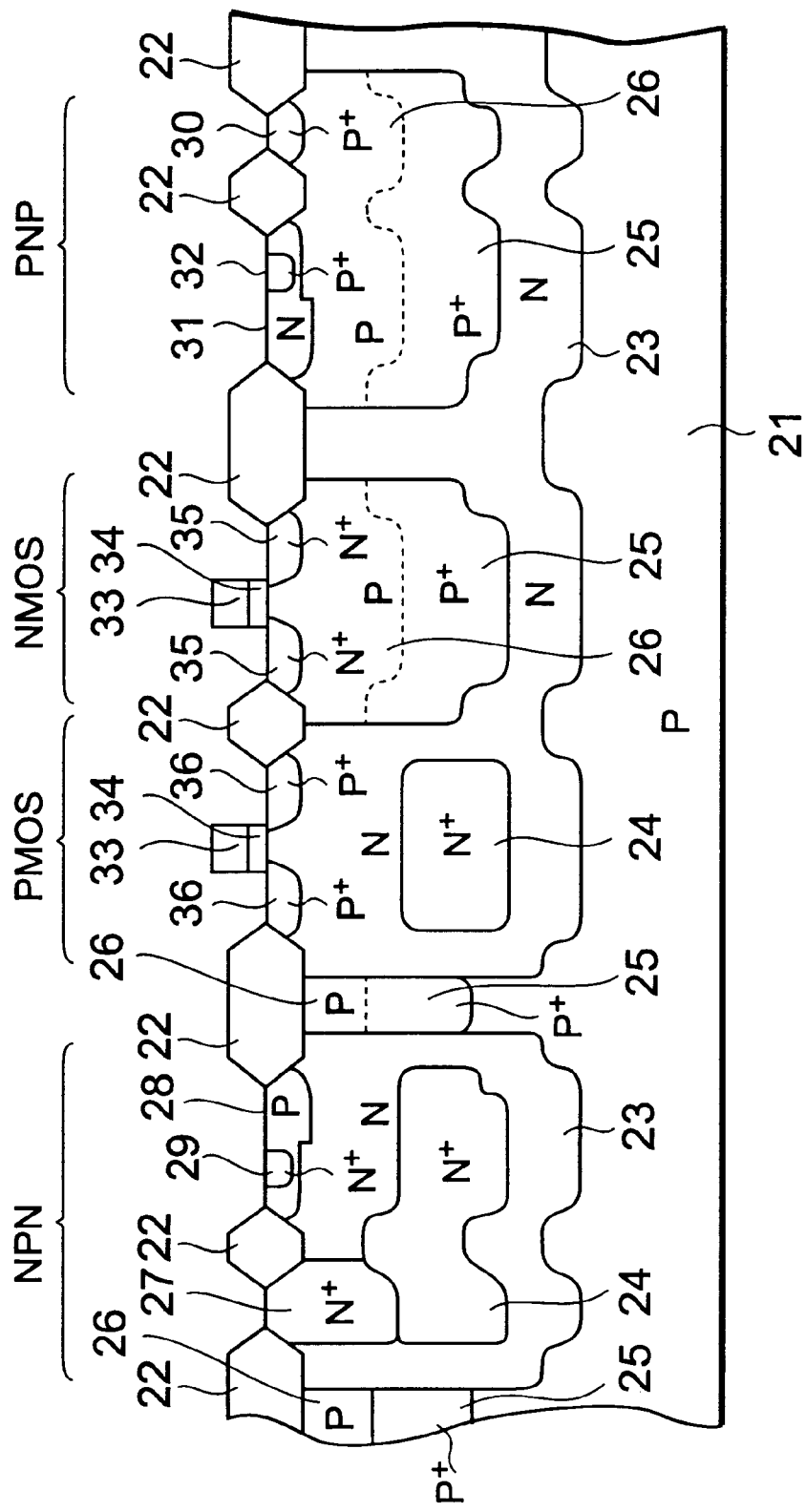
FIG. 23 is a cross-sectional view showing the layer structure of the semiconductor device formed according to a conventional manufacturing method of the semiconductor device.

This is an example of embodiment of the semiconductor device according to this invention, where FIG. 22(A) is a sectional view of the layer structure of the semiconductor device of his embodiment, and FIG. 22(B) is a sectional view along the line III—III of FIG. 22(A).

As shown in FIG. 22(A), the semiconductor device 60 according to this embodiment is a semiconductor device having a PNP-type bipolar transistor 66 element-isolated from other semiconductor elements by an element isolation region 62 and an insulating well region 64 on a p-type silicon substrate 68. The PNP-type bipolar transistor 66 is of vertical type, and is provided with a p-type emitter region 70, an n-type base region 72, a p-type collector region 74, and a collector electrode lead-out region 76.

The p-type collector region 74 is electrically isolated from the p-type silicon substrate 68, at its lower part by the n-type lower isolation region 78 and around its periphery by the n-type annular isolation region 80. The n-type annular isolation region 80 is formed in annular form downward from the element isolation region 62 as shown in FIGS. 22(A) and 22(B), and electrically isolates the p-type collector region 74 from the p-type silicon substrate 68 by surrounding the periphery of the p-type collector region 74 and the upper periphery of the n-type lower isolation region 76.

Since the n-type isolation region comprises the n-type lower isolation region 78 and the n-type annular isolation region 80, the depth of the n-type lower isolation region 78 can be controlled freely, and hence it is possible to independently optimize the electrical characteristics of the V-PNP.

In Embodiments 1 to 4 of the methods of the invention and the embodiment of the device according to this invention, the case of using a p-type substrate has been described as an example, but this invention is also applicable to the case of using an n-type substrate instead of the p-type substrate. When an n-type substrate is employed, it is only necessary to interchange the n-type and the p-type in the above-mentioned embodiments.

When an NPN bipolar transistor and a V-PNP bipolar transistor are formed on the same substrate, according to the first method of the invention, the predetermined impurity regions can be formed with a small number of masks by employing the reverse ion implantation.

According to the second, third, and fourth methods of the invention, when manufacturing a semiconductor device having, for example, an NPN bipolar transistor and a V-PNP bipolar transistor on a p-type substrate, in the formation of the impurity regions, an n-type lower isolation region, then an n-type collector region of the V-PNP bipolar transistor can be formed respectively in independent manner using the same number of masks as used in the first method of the invention. In this way, the depth of the n-type collector region can be controlled freely, and hence the electrical characteristics of the V-PNP bipolar transistor can be optimized independent of those of the NPN bipolar transistor.

Moreover, since the n-type base region of the V-PNP bipolar transistor is formed independently rather than by a reverse ion implantation, the peak impurity concentration of the base region can be controlled as desired.

In the semiconductor device according to this invention, in the case of a semiconductor device having an NPN bipolar transistor on a p-type silicon substrate, for example, the n-type isolation region for isolating the p-type collector region of the V-PNP bipolar transistor from the p-type silicon substrate comprises an n-type lower isolation region and an n-type annular isolation region. Accordingly, the depth of the n-type lower isolation region can be controlled freely, and hence the electrical characteristics of the V-PNP bipolar transistor can be optimized independent of those of the NPN bipolar transistor.

It is apparent that the present invention is not limited to the above embodiments, but may be modified and changed without departing from the scope and spirit of the invention.

What is claimed is:

1. In a method of manufacturing a semiconductor device provided with a first bipolar transistor having a first conductivity type base region and a second bipolar transistor having a second conductivity type base region on a second conductivity type silicon substrate, the manufacturing method of the semiconductor device wherein the formation of impurity regions includes, a step of simultaneously forming a first conductivity type collector region of the second bipolar transistor and a first conductivity type isolation region for a second conductivity type collector region of the first bipolar transistor by means of an ion implantation of a first conductivity type impurity, and a step of simultaneously forming a second conductivity type base region of the second bipolar transistor and a second conductivity type temporary base region of the first bipolar transistor by means of an ion implantation of a second conductivity type impurity, then converting the second conductivity type temporary base region of the first bipolar transistor into a first conductivity type base region by means of an ion implantation of a first conductivity type impurity.

2. The method of manufacturing a semiconductor device as claimed in claim 1, further comprising, a first ion implantation step of first conductivity type impurity for simultaneously forming a first conductivity type collector region of the second bipolar transistor and a first conductivity type isolation region for a second conductivity type collector region of the first bipolar transistor by means of an ion implantation of a first conductivity type impurity, a first ion implantation step of second conductivity type impurity for simultaneously forming a second conductivity type base region of the second bipolar transistor and a second conductivity type temporary base region of the first bipolar transistor by means of an ion implantation of a second conductivity type impurity using the same mask as that used in the first ion implantation step of first conductivity type impurity, a second ion implantation step of second conductivity type impurity for forming a second conductivity type collector region within a first conductivity type isolation region of the first bipolar transistor by means of an ion implantation of a second conductivity type impurity, and a second ion implantation step of first conductivity type impurity for converting the second conductivity type temporary base region of the first bipolar transistor into a first conductivity type base region by means of an ion implantation of a first conductivity impurity using the same mask as that used in the second ion implantation of second conductivity type impurity.

3. In a method of manufacturing a semiconductor device provided with a first bipolar transistor having a first conductivity type base region and a second bipolar transistor having a second conductivity type base region on the same second conductivity type silicon substrate, the method of manufacturing the semiconductor device wherein the formation of impurity regions comprises, a step of simultaneously forming a first conductivity type collector region of the second bipolar transistor and a first conductivity type annular isolation region making contact with the periphery of a collector formation region of the first bipolar transistor, and a step of forming a first conductivity type lower isolation region in a region including a second conductivity type collector formation region of the first bipolar transistor and a region further below by means of an ion implantation of a first conductivity type impurity, and forming a second conductivity type collector region in the collector formation region of the first bipolar transistor by means of an ion implantation of a second conductivity type impurity using the same mask, and forming a first conductivity type base region of the first bipolar transistor by means of an ion implantation of a first conductivity type impurity using the same mask again.

4. The method of manufacturing a semiconductor device as claimed in claim 3, comprising, a first ion implantation step of first conductivity type impurity for simultaneously forming a first conductivity type collector region of the second bipolar transistor and a first conductivity type annular isolation region making contact with the periphery of a collector formation region of the first bipolar transistor by means of an ion implantation of a first conductivity type impurity, a first ion implantation step of second conductivity type impurity for forming a second conductivity type base region of the second bipolar transistor by means of an ion implantation of a second conductivity type impurity using the same mask as that used in the first ion implantation step of first conductivity type impurity, a second ion implantation step of first conductivity type impurity for forming a first conductivity type lower isolation region in a region including the collector formation region of the first bipolar transistor and a region further below by means of an ion implantation of a first conductivity type impurity, a second ion implantation step of second conductivity type impurity for forming a second conductivity type collector region in the collector formation region of the first bipolar transistor by means of an ion implantation of a second conductivity type impurity using a mask the same as that used in the second ion implantation step of first conductivity type impurity, and a third ion implantation step of first conductivity type impurity for forming a first conductivity type base region of the first bipolar transistor by means of an ion implantation of a first conductivity type impurity using the same mask as that used in the second ion implantation step of second conductivity type impurity.

5. In a method of manufacturing a semiconductor device provided with a first bipolar transistor having a first conductivity type base region, a first conductivity type MOSFET, and a second conductivity type MOSFET on the same silicon substrate, the method of manufacturing a semiconductor device in which the formation of impurity regions comprises, a step of simultaneously forming a first conductivity type well region of the second conductivity type MOSFET and a first conductivity type annular isolation region making contact with the periphery of a collector formation region of the first bipolar transistor by means of an ion implantation of a first conductivity type impurity, a step of forming a first conductivity type lower isolation region in a region including the collector formation region of the first bipolar transistor and a region further below by means of an ion implantation of a first conductivity type impurity, and a step of forming a second conductivity type collector region in the collector formation region of the first bipolar transistor by means of an ion implantation of a second conductivity type impurity using the same mask as in the above, and further forming a first conductivity type base region of the first bipolar transistor by means of an ion implantation of a first conductivity type impurity using again the same mask used before.

6. The method of manufacturing a semiconductor device as claimed in claim 5, wherein, between the step of simultaneously forming a first conductivity type well region of a second conductivity type MOSFET and a first conductivity type annular isolation region making contact with the periphery of a collector formation region of a first bipolar transistor, and the step of forming a first conductivity type lower isolation region, there are included, a formation step of a first conductivity type deep annular isolation region for simultaneously forming a first conductivity type collector region of the second bipolar transistor and a first conductivity type deep annular isolation region provided on the lower side and making contact with the first conductivity type annular isolation region, and a second ion implantation step of second conductivity type impurity for forming a second conductivity type base region of the second bipolar transistor by means of an ion implantation of a second conductivity type impurity using the same mask as that used in the formation step of the first conductivity type deep annular isolation region.

7. In a method of manufacturing a semiconductor device provided with a first bipolar transistor having a first conductivity type base region, a second bipolar transistor having a second conductivity type base region, a first conductivity type MOSFET, and a second conductivity type MOSFET on the same silicon substrate, the method of manufacturing the semiconductor device in which the formation of the impurity regions includes, a first ion implantation step of first conductivity type impurity for simultaneously forming a first conductivity type well region of the second conductivity type MOSFET and a first conductivity type annular isolation region making contact with the periphery of a collector formation region of the first bipolar transistor by means of an ion implantation of a first conductivity type impurity, a first ion implantation step of second conductivity type impurity for simultaneously forming a second conductivity type well region of the first conductivity type MOSFET and a second conductivity type insulation well region electrically isolating the second bipolar transistor and the first bipolar transistor by means of an ion implantation of a second conductivity type impurity, a second ion implantation step of first conductivity type impurity for forming a first conductivity type collector region of the second bipolar transistor by means of an ion implantation of a first conductivity type impurity, a second ion implantation step of second conductivity type impurity for forming a second conductivity type base region of the second bipolar transistor by means of an ion implantation of a second conductivity type impurity using the same mask as that used in the second ion implantation step of first conductivity type impurity, a third ion implantation step of first conductivity type impurity for forming a first conductivity type lower isolation region in a region including the collector formation region of the first bipolar transistor and a region further below by means of an ion implantation of a first conductivity type impurity, a third ion implantation step of second conductivity type impurity for forming a second conductivity type collector region in the collector formation region of the first bipolar transistor by means of an ion implantation of a second conductivity type impurity using the same mask as that used in the third ion implantation step of first conductivity type impurity, and a fourth ion implantation step of first conductivity type impurity for forming a first conductivity type base region of the first bipolar transistor by means of an ion implantation of a first conductivity type impurity using the same mask as that used in the third ion implantation step of second conductivity type impurity.

8. The method of manufacturing a semiconductor device as claimed in claim 7, wherein the second ion implantation step of first conductivity impurity includes simultaneous formation of a first conductivity type collector region of the second bipolar transistor and a first conductivity type deep annular isolation region provided on the underside of and in contact with the first conductivity type annular isolation region.

* * * * *